(12) United States Patent
Chunduri et al.

(10) Patent No.: US 11,671,517 B2
(45) Date of Patent: Jun. 6, 2023

(54) COMPRESSED DATA TRANSMISSIONS IN NETWORKS IMPLEMENTING INTERIOR GATEWAY PROTOCOL

(71) Applicant: Huawei Technologies Co., Ltd., Shenzhen (CN)

(72) Inventors: Uma S. Chunduri, Fremont, CA (US); Toerless Eckert, Mountain View, CA (US); Alvaro Retana, Raleigh, NC (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/399,905

(22) Filed: Aug. 11, 2021

(65) Prior Publication Data

US 2021/0377367 A1    Dec. 2, 2021

Related U.S. Application Data

(63) Continuation of application No. PCT/US2020/017246, filed on Feb. 7, 2020.

(60) Provisional application No. 62/811,912, filed on Feb. 28, 2019.

(51) Int. Cl.
    *G06F 15/16*      (2006.01)
    *H04L 69/04*      (2022.01)
    *H04L 47/38*      (2022.01)

(52) U.S. Cl.
    CPC .............. *H04L 69/04* (2013.01); *H04L 47/38* (2013.01)

(58) Field of Classification Search
    CPC ................................ H04L 69/04; H04L 47/38
    See application file for complete search history.

(56) References Cited

U.S. PATENT DOCUMENTS

| | | | | |
|---|---|---|---|---|
| 5,389,922 A | * | 2/1995 | Seroussi | ................. H03M 7/46 341/51 |
| 6,704,866 B1 | * | 3/2004 | Benayoun | ........... H04L 63/0428 713/153 |
| 6,883,035 B2 | * | 4/2005 | Hannu | ..................... H04B 1/66 709/217 |

(Continued)

FOREIGN PATENT DOCUMENTS

| | | | | |
|---|---|---|---|---|
| CN | 104410723 A | | 3/2015 | |
| CN | 106506456 A | * | 3/2017 | ......... H04L 63/0428 |
| WO | 2019236221 A1 | | 12/2019 | |

OTHER PUBLICATIONS

Hannu, H., et al., "Robust Generic message size Reduction (ROGER)," draft-hannu-rohc-roger-01.txt, Jul. 6, 2001, XP015014033, 29 pages.

(Continued)

*Primary Examiner* — Hieu T Hoang
(74) *Attorney, Agent, or Firm* — Conley Rose, P.C.

(57) ABSTRACT

A method is performed by a network element (NE) in a network implementing an Interior Gateway Protocol (IGP). The method comprises generating a message comprising a header and data, wherein the header comprises a length of the data prior to compressing the data, a length of the data after compressing the data, and a compression identifier, compressing the data based on a compression scheme identified by the compression identifier to obtain compressed data, and forwarding a compressed message comprising the header and the compressed data to another NE in the network.

20 Claims, 16 Drawing Sheets

(56) References Cited

U.S. PATENT DOCUMENTS

| | | | |
|---|---|---|---|
| 7,649,909 B1 | 1/2010 | Archard et al. | |
| 7,903,666 B1* | 3/2011 | Kumar | H04L 45/48 370/395.31 |
| 8,725,690 B1* | 5/2014 | Ruef | G06F 11/1448 707/661 |
| 8,868,924 B1* | 10/2014 | Filatov | G06F 8/70 717/110 |
| 2002/0196743 A1* | 12/2002 | Thalanany | H04L 47/32 370/252 |
| 2003/0090397 A1* | 5/2003 | Rasmussen | H03M 7/3086 341/51 |
| 2005/0111494 A1* | 5/2005 | Kecskemeti | H04L 69/16 370/395.52 |
| 2007/0260746 A1 | 11/2007 | Mirtorabi et al. | |
| 2008/0120315 A1 | 5/2008 | Ionescu et al. | |
| 2009/0052452 A1* | 2/2009 | Patel | H04L 45/04 370/392 |
| 2010/0223237 A1* | 9/2010 | Mishra | G06F 9/30174 707/693 |
| 2011/0110370 A1 | 5/2011 | Moreno et al. | |
| 2011/0296051 A1* | 12/2011 | Vange | H04L 41/12 709/238 |
| 2012/0268298 A1* | 10/2012 | Oh | H03M 7/3091 341/87 |
| 2012/0275424 A1* | 11/2012 | Chen | H03M 7/6011 370/466 |
| 2013/0297814 A1* | 11/2013 | Annamalaisami | H04L 69/08 709/230 |
| 2014/0369356 A1 | 12/2014 | Bryant et al. | |
| 2015/0326695 A1* | 11/2015 | Pang | H04L 69/04 370/477 |
| 2018/0367635 A1* | 12/2018 | Li | H04L 12/66 |
| 2019/0014055 A1* | 1/2019 | Gupta | H04L 49/9084 |
| 2019/0068217 A1* | 2/2019 | Bannon | H03M 7/6005 |
| 2021/0083940 A1* | 3/2021 | Peng | H04L 41/0893 |

OTHER PUBLICATIONS

ITU-T V.44, "Series V: Data Communication Over the Telephone Network; Error control;Data compression procedures, Telecommunication Standardization Sector of ITU," Nov. 2000, XP055744806, 59 pages.

Crabbe, et al., "Path Computation Element Communication Protocol (PCEP) Extensions for PCE-Initiated LSP Setup in a Satateful PCE Model," RFC 8281, Dec. 2017, 20 pages.

Filsfils, Ed., et al. "Segment Routing Architecture," RFC 8402, Jul. 2018, 32 pages.

Almi, Ed., et al., "Application-Layer Traffic Optimization (ALTO) Protocol," RFC 7285, Sep. 2014, 91 pages.

Callon, "Use of OSI IS-IS for Routing in TCP/IP and Dual Enviomments," RFC 1195, Dec. 1990, 68 pages.

Moy, "OSPF Version 2," RFC 2328, Apr. 1998, 244 pages.

Coltun, et al., "OSPF for IPv6," RFC 5340, Jul. 2008, 94 pages.

Deutsch, "DEFLATE Compressed Data Format Specification version 1.3," RFC 1951, May 1996, 15 pages.

Friend, et al., "IP Payload Compression Using LZS," RFC 2395, Dec. 1998, 9 pages.

Heath, et al., "IP Payload Compression Using ITU-T V.44 Packet Method," RFC 3051, Jan. 2001, 8 pages.

Psenak, et al., "OSPFv2 Prefix/Link Attribute Advertisement," RFC 7684, Nov. 2015, 15 pages.

Chunduri, U., et al., "Preferred Path Route Graph Structure," draft-ce-lsr-ppr-graph-01, Oct. 23, 2018, 12 pages.

Chunduri, U., et al., "Preferred Path Routing (PPR) in IS-IS," draft-chunduri-lsr-isis-preferred-path-routing-01, Jul. 2, 2018, 50 pages.

Ginsberg, L., Ed et al., "IS-IS Traffic Engineering (TE) Metric Extensions," draft-ietf-lsr-isis-rfc7810bis-05, Dec. 20, 2018, 19 pages.

Li, T., Ed., et al., "Dynamic Flooding on Dense Graphs," draft-li-lsr-dynamic-flooding-02, Dec. 3, 2018, 37 pages.

Pereira, R., "IP Payload Compression Using DEFLATE," Network Working Group, RFC 2394, Dec. 1998, 6 pages.

Shachem, A., et al., "IP Payload Compression Protocol (IPComp)," Network Working Group, RFC 3173, Sep. 2001, 13 pages.

Bhaskar, N., et al., "Bootstrap Router (BSR) Mechanism for Protocol Independent Multicast (PIM)," Network Working Group, RFC 5059, Jan. 2008, 41 pages.

Bhatia, M., et al., "OSPFv2 HMAC-SHA Cryptographic Authentication," Network Working Group, RFC 5709, Oct. 2009, 14 pages.

Bhatia, M., et al., "Security Extension for OSPFv2 When Using Manual Key Management," Network Working Group, RFC 7474, Apr. 2015, 14 pages.

Farkas, J., Ed., et al., "IS-IS Path Control and Reservation," Internet Engineering Task Force (IETF), RFC 7813, Jun. 2016, 33 pages.

* cited by examiner

COMPRESSED DATA TRANSMISSIONS IN NETWORKS IMPLEMENTING INTERIOR GATEWAY PROTOCOL

CROSS-REFERENCE TO RELATED APPLICATIONS

The present application is a continuation of International Patent Application PCT/US2020/017246 filed Feb. 7, 2020 by Futurewei Technologies, Inc., which claims the benefit of U.S. Provisional Patent Application No. 62/811,912 filed Feb. 28, 2019 by Uma S. Chunduri, et al., and entitled "Advertising and Usage of Compressed Link State Updated in Interior Gateway Protocols," both of which are incorporated herein by reference as if reproduced in their entireties.

FIELD OF INVENTION

The present disclosure pertains to the field of data transmission in a network implementing an Interior Gateway Protocol (IGP). In particular, the present disclosure relates to the compression of data flooded through the network implementing an IGP.

BACKGROUND

An IGP is a type of protocol used for exchanging information among network elements (NEs), such as routers, switches, gateways, etc., within a network (also referred to herein as an "autonomous system (AS)" or a "domain"). This information exchanged using IGP may include routing information and/or state information. The information can be used to route data using network-layer protocols, such as Internet Protocol (IP).

IGPs can be divided into two categories: distance-vector routing protocols and link-state routing protocols. In a network implementing a distance-vector routing protocol, each NE in the network does not possess information about the full network topology. Instead, each NE advertises a distance value calculated to other routers and receives similar advertisements from other routers. Each NE in the network uses the advertisements to populate a local routing table.

In contrast, in a network implementing a link-state routing protocol, each NE stores network topology information about the complete network topology. Each NE then independently calculates the next best hop from the NE for every possible destination in the network using the network topology information. The NE then stores a routing table including the collection of next best hops to every possible destination. Examples of link-state routing protocols include Intermediate System to Intermediate System (IS-IS), Open Shortest Path First (OSPF) version 2 (OSPFv2), and OSPF version 3 (OSPFv3).

Each NE in the network forwards the information encoded according to an IGP to adjacent NEs, thereby flooding the network with the information that is saved at each of the NEs in the network. Therefore, NEs in a network implementing an IGP flood the network with messages that transmit information that can be used to establish a route or a network topology.

SUMMARY

According to a first aspect of the present disclosure, there is provided a method performed by a network element (NE) in a network implementing an Interior Gateway Protocol (IGP), comprising generating a message comprising a header and data, wherein the header comprises a length of the data prior to compressing the data, a length of the data after compressing the data, and a compression identifier, compressing the data based on a compression scheme identified by the compression identifier to obtain compressed data, and forwarding a compressed message comprising the header and the compressed data to other NEs in the network.

Optionally, in a first implementation according to the first aspect, the compression scheme identified by the compression identifier is a stateful compression scheme, wherein the header further comprises a dictionary identifier identifying a dictionary used in compressing the data, and wherein the method further comprises receiving the dictionary to use in compressing the data from a stateful compression controller before receiving the message, and storing the dictionary in a memory of the NE.

Optionally, in a second implementation according to the first aspect or any other implementation of the first aspect, the NE is also a stateful compression controller of the network, wherein, before receiving the message, the method further comprises monitoring uncompressed messages being flooded through the network to determine a dictionary used for compressing the data forwarded through the network, wherein the dictionary defines an uncompressed bit string and a corresponding compressed codeword, assigning a dictionary identifier to the dictionary, transmitting the dictionary identifier and the dictionary to the other NEs in the network, and storing the dictionary identifier and the dictionary in a memory of the NE, wherein the compression scheme identified by the compression identifier is a stateful compression scheme, and wherein the header further comprises the dictionary identifier.

Optionally, in a third implementation according to the first aspect or any other implementation of the first aspect, wherein the method further comprises continuing to monitor uncompressed messages and compressed messages being flooded through the network to determine an update to the dictionary based on a count of the uncompressed bit string occurring in the uncompressed messages and the compressed messages, wherein the update to the dictionary defines the second uncompressed bit string and a second corresponding codeword, and transmitting the dictionary identifier and the update to the dictionary to the other NEs.

Optionally, in a fourth implementation according to the first aspect or any other implementation of the first aspect, wherein the method further comprises storing a dictionary and a corresponding dictionary identifier, wherein the dictionary stores a plurality of mappings between uncompressed bit strings and corresponding codewords.

Optionally, in a fifth implementation according to the first aspect or any other implementation of the first aspect, wherein after receiving a dictionary and a dictionary identifier from a stateful compression controller, the method further comprises waiting a predetermined buffer time before compressing the data.

Optionally, in a sixth implementation according to the first aspect or any other implementation of the first aspect, wherein the method further comprises maintaining, at a memory of the NE, instructions corresponding to a plurality of different compression schemes and the compression identifier corresponding to each of the plurality of different compression schemes.

Optionally, in a seventh implementation according to the first aspect or any other implementation of the first aspect, wherein compressing the data based on the compression scheme identified by the compression identifier comprises executing the instructions corresponding to the compression scheme identified by the compression identifier to compress the data.

Optionally, in an eighth implementation according to the first aspect or any other implementation of the first aspect, the header comprises a type field, a decompressed length field, a compression identifier field, a type field, and a compressed length field, wherein the type field carries a value indicating that the compressed message carries the compressed data, wherein the decompressed length field carries the length of the data prior to compressing the data, wherein the compressed length field carries the length of the compressed data, wherein the compression identifier field carries the compression identifier, and wherein the type field carries a value identifying a type of the data being compressed.

Optionally, in a ninth implementation according to the first aspect or any other implementation of the first aspect, wherein when the compression identifier field carries the compression identifier corresponding to a stateful compression scheme, the header comprises a dictionary identifier field carrying a dictionary identifier corresponding to a dictionary used for compressing the data.

A second aspect of the present disclosure relates to a method performed by a NE in a network implementing an IGP, comprising receiving a message comprising a header and compressed data, wherein the header comprises a length of data prior to compression, a length of the compressed data, and a compression identifier, decompressing the compressed data based on a compression scheme identified by the compression identifier to obtain the data prior to compression, and storing at least one of the data or the compressed data in a local memory of the NE.

Optionally, in a first implementation according to the second aspect, the header further comprises a dictionary identifier identifying a dictionary used in compressing and decompressing the data, wherein decompressing the data based on the compression scheme identified by the compression identifier further comprises decompressing the data based on the dictionary identifier and the compression identifier.

Optionally, in a second implementation according to the second aspect or any other implementation of the second aspect, the header further comprises a dictionary identifier identifying a dictionary used in compressing and decompressing the data, and wherein the method further comprises storing a dictionary and a corresponding dictionary identifier in NE local memory of the NE, wherein the dictionary stores a plurality of mappings between uncompressed bit strings and corresponding codewords.

Optionally, in a third implementation according to the second aspect or any other implementation of the second aspect, wherein the method further comprises maintaining, at the local memory of the NE, instructions corresponding to a plurality of different compression schemes and the compression identifier corresponding to each of the plurality of different compression schemes.

Optionally, in a fourth implementation according to the second aspect or any other implementation of the second aspect, wherein decompressing the data based on the compression scheme identified by the compression identifier further comprises executing the instructions corresponding to the compression scheme identified by the compression identifier to decompress the data.

A third aspect of the present disclosure relates to an NE in a network implanting an IGP. The NE comprises memory storing instructions, and a processor coupled to the memory and configured to execute the instructions, which cause the processor to be configured to generate a message comprising a header and data, wherein the header comprises a length of the data prior to compressing the data, a length of the data after compressing the data, and a compression identifier, compress the data based on a compression scheme identified by the compression identifier to obtain compressed data, and forward a compressed message comprising the header and the compressed data to other NEs in the network.

Optionally, in a first implementation according to the first aspect, the compression scheme identified by the compression identifier is a stateful compression scheme, wherein the header further comprises a dictionary identifier identifying a dictionary used in compressing the data, and wherein the instructions further cause the processor to be configured to receive the dictionary to use in compressing the data from a stateful compression controller before receiving the message, and store the dictionary in a memory of the NE.

Optionally, in a second implementation according to the third aspect or any other implementation of the third aspect, the NE is also a stateful compression controller of the network, wherein, before receiving the message, the instructions further cause the processor to be configured to monitor uncompressed messages being flooded through the network to determine a dictionary used for compressing the data forwarded through the network, wherein the dictionary defines an uncompressed bit string and a corresponding compressed codeword, assign a dictionary identifier to the dictionary, transmit the dictionary identifier and the dictionary to the other NEs in the network, and store the dictionary identifier and the dictionary in a memory of the NE, wherein the compression scheme identified by the compression identifier is a stateful compression scheme, and wherein the header further comprises the dictionary identifier.

Optionally, in a third implementation according to the third aspect or any other implementation of the third aspect, the instructions further cause the processor to be configured to continue to monitor uncompressed messages and compressed messages being flooded through the network to determine an update to the dictionary based on a count of the uncompressed bit string occurring in the uncompressed messages and the compressed messages, wherein the update to the dictionary defines the second uncompressed bit string and a second corresponding codeword, and transmit the dictionary identifier and the update to the dictionary to the other NEs.

Optionally, in a fourth implementation according to the third aspect or any other implementation of the third aspect, the instructions further cause the processor to be configured to store a dictionary and a corresponding dictionary identifier, wherein the dictionary stores a plurality of mappings between uncompressed bit strings and corresponding codewords.

Optionally, in a fifth implementation according to the third aspect or any other implementation of the third aspect, wherein after receiving a dictionary and a dictionary identifier from a stateful compression controller, the instructions further cause the processor to be configured to wait a predetermined buffer time before compressing the data.

Optionally, in a sixth implementation according to the third aspect or any other implementation of the third aspect, wherein the memory is further configured to store compression instructions corresponding to a plurality of different compression schemes and the compression identifier corresponding to each of the plurality of different compression schemes.

Optionally, in a seventh implementation according to the third aspect or any other implementation of the third aspect, the instructions further cause the processor to be configured to executing the compression instructions corresponding to the compression scheme identified by the compression identifier to compress the data.

Optionally, in an eighth implementation according to the third aspect or any other implementation of the third aspect, the header comprises a type field, a decompressed length field, a compression identifier field, a type field, and a compressed length field, wherein the type field carries a value indicating that the compressed message carries the compressed data, wherein the decompressed length field carries the length of the data prior to compressing the data, wherein the compressed length field carries the length of the compressed data, wherein the compression identifier field carries the compression identifier, and wherein the type field carries a value identifying a type of the data being compressed.

Optionally, in a ninth implementation according to the third aspect or any other implementation of the third aspect, when the compression identifier field carries the compression identifier corresponding to a stateful compression scheme, the header comprises a dictionary identifier field carrying a dictionary identifier corresponding to a dictionary used for compressing the data.

A fourth aspect of the present disclosure relates to a NE in a network implementing an IGP. The NE comprises a memory storing instructions, and a processor coupled to the memory and configured to execute the instructions, which cause the processor to be configured to receive a message comprising a header and compressed data, wherein the header comprises a length of data prior to compression, a length of the compressed data, and a compression identifier, decompress the compressed data based on a compression scheme identified by the compression identifier to obtain the data prior to compression, store at least one of the data or the compressed data in a local memory of the NE.

Optionally, in a first implementation of the fourth aspect, the header further comprises a dictionary identifier identifying a dictionary used in compressing and decompressing the data, wherein the instructions further cause the processor to be configured to decompress the data based on the dictionary identifier and the compression identifier.

Optionally, in a second implementation according to the fourth aspect or any other implementation of the fourth aspect, the header further comprises a dictionary identifier identifying a dictionary used in compressing and decompressing the data, and wherein the instructions further cause the processor to be configured to store a dictionary and a corresponding dictionary identifier in NE local memory of the NE, wherein the dictionary stores a plurality of mappings between uncompressed bit strings and corresponding codewords.

Optionally, in a third implementation according to the fourth aspect or any other implementation of the fourth aspect, the memory is further configured to store compression instructions corresponding to a plurality of different compression schemes and the compression identifier corresponding to each of the plurality of different compression schemes.

Optionally, in a fourth implementation according to the fourth aspect or any other implementation of the fourth aspect, the instructions further cause the processor to be configured to execute the compression instructions corresponding to the compression scheme identified by the compression identifier to decompress the data.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
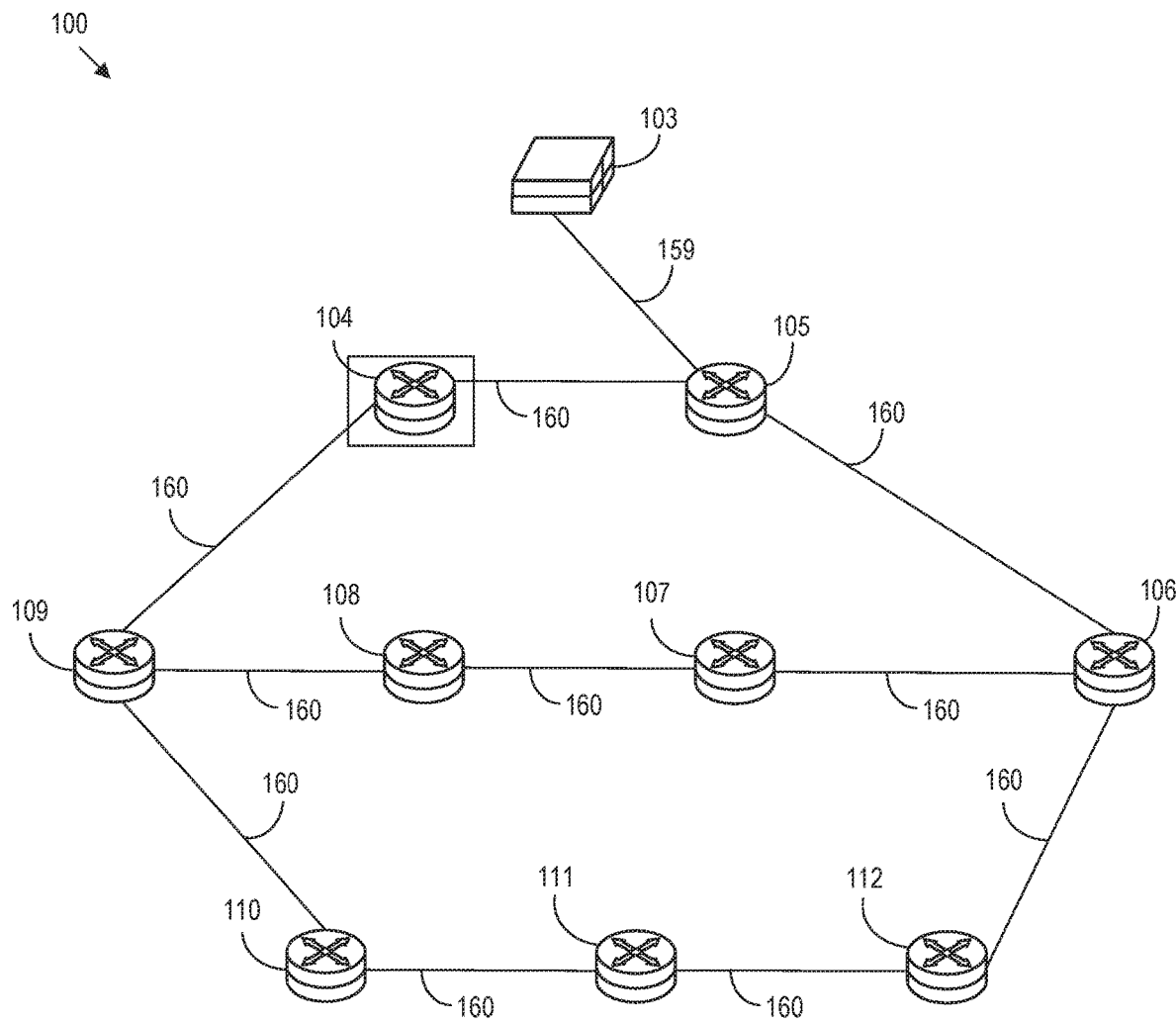
FIG. 1 is a diagram illustrating a network configured to transmit compressed messages using an IGP according to various embodiments of the disclosure.

FIG. 1 is a diagram illustrating a network 100 (also referred to herein as an "AS" or "domain") configured to transmit compressed messages using an IGP according to various embodiments of the disclosure. Network 100 is a network or subnetwork configured to implement an IGP, such as IS-IS, OSPFv2, or OSPFv3, according to various embodiments of the disclosure. The network 100 comprises a central entity 103 (also referred to herein as a "controller") and multiple NEs 104-112. The central entity 103 is coupled to at least one of the NEs 105 via a link 159, and the NEs 104-112 are interconnected by links 160.

In an embodiment, the central entity 103 may be substantially similar to a Path Computation Element (PCE), which is further described in Internet Engineering Task Force (IETF) Request for Comments (RFC) 8281, entitled "Path Computation Element Communication Protocol (PCEP) Extensions for PCE-Initiated LSP Setup in a Stateful PCE Model," by E. Crabbe, dated December 2017. In an embodiment, the central entity 103 may be substantially similar to a Software Defined Network Controller (SDNC), which is further described in the IETF RFC 8402 entitled "Segment Routing Architecture," by C. Filsfils, dated July 2018. In an embodiment, the central entity 103 may be substantially similar to an Application Layer Traffic Optimization (ALTO) server, which is further described in the IETF RFC 7285, entitled "Application Layer Traffic Optimization (ALTO) Protocol," by R. Alimi, dated September 2014.

NEs 104-112 (also referred to herein as "nodes") may each be a physical device, such as a router, a bridge, a network switch, or a logical device, such as a virtual machine, configured to forward data across the network 100 by encoding the data according to IGP. In an embodiment, at least some of the NEs 104-112 are headend nodes or edge nodes positioned at an edge of the network 100. For example, one or more of NEs 104-112 may be an ingress node at which traffic (e.g., control packets and data packets) is received, and one or more of NEs 104-112 may be an egress node from which traffic is transmitted. Some of the NEs 104-112, such as 108 and 107, may be interior nodes that are configured to receive and forward traffic from another NE 104-112 in the network 100.

The link 159 may be a wired link, wireless link, or interface interconnecting one of the NEs 105 and the central entity 103. Similarly, the links 160 may be wired links, wireless links, or interfaces interconnecting each of the NEs 104-112.

Although only nine NEs 104-112 are shown in FIG. 1, it should be appreciated that the network 100 shown in FIG. 1 may include any number of NEs. In an embodiment, the central entity 103 and NEs 104-112 are configured to implement various packet forwarding protocols, such as, but not limited to, Multi-protocol Label Switching (MPLS), IP version 4 (IPv4), IP version 6 (IPv6), and Big Packet Protocol.

Each of the NEs 104-112 in the network 100 maintains one or more link state databases (LSDBs) storing link-state information about NEs 104-112 and links 160 in any given area or network. Link attributes stored in these LSDBs include local/remote IP address, local/remote interface identifiers, link metrics and traffic engineering (TE) metrics, link bandwidth, reserveable bandwidth, per Class-of-Service (CoS) class reservation state, preemption, and Shared Risk Link Groups (SLRGs). Each of the NEs 104-112 may retrieve topology information from the locally stored LSDBs and distribute the topology information to a consumer or central entity 103.

The central entity 103 may determine the network topology using the advertisements sent by each of the NEs 104-112 in the network 100, where the advertisements may include prefixes, security identifiers (SIDs), TE information, identifiers (IDs) of adjacent NEs, links, interfaces, ports, and routes. The central entity 103 is configured to collect TE information and link-state information from NEs 104-112 within the network 100.

In some embodiments, the central entity 103 is configured to determine or construct paths between two NEs 104-112 positioned at edges of the network 100 using a network topology of the network 100 and capabilities of NEs 104-112 within network 100. In an embodiment in which the network 100 implements preferred path routing, the central entity 103 is configured to determine a shortest path between the two NEs 104-112, one or more preferred path routes (PPRs) between the two NEs 104-112, and/or one or more PPR graphs between the two NEs 104-112.

A shortest path refers to a path between two NEs or between a source and destination that is determined based on a metric, such as, for example, a cost or weight associated with each link on the path, a number of NEs on the path, a number of links on the path, etc. In an embodiment, a shortest path may be computed for a destination using a Dijkstra's Shortest Path First (SPF) algorithm. A PPR (also referred to herein as a "Non-Shortest Path (NSP)") refers to a custom path or any other path that may deviate from the shortest path computed between two NEs or between a source and destination. A PPR may also be the same as the shortest path. The PPRs may be determined based on an application or server request for a path between two NEs 104-112 or between a source and destination that satisfies one or more network characteristics (such as TE) or service requirements. PPRs are further defined in International Application No. PCT/US2019/015419, filed on Jan. 28, 2019. A PPR graph refers to a collection of multiple PPRs between one or more ingress NEs 104-112 (also referred to herein as "sources") and one or more egress NEs 104-112 (also referred to herein as "destinations"). PPR graphs are further defined in International Application No. PCT/US2019/030440, filed on May 2, 2019. The shortest path, PPR, and PPR graphs may each comprise a sequential ordering of one or more NEs 104-112 and/or links 160, which may be identified by labels, addresses, or IDs.

Upon determining a shortest path, PPR, and/or PPR graph that is to be provisioned by the NEs 104-106 in the network, the central entity 103 transmits information describing the shortest path, PPR, and/or PPR graph to one of the NEs 105 via the link 159. In some cases, the central entity 103 may also transmit information describing the topology information of the network 100 to one of the NEs 105 via link 159.

In either case, when the NE 105 receives information from the central entity 103, or any other source or client, the NE 105 encodes the information using the IGP to transmit the information to the remaining NEs 104 and 106-112 in the network. For example, after NE 105 receives the information from the central entity 103, or any other source or client, NE 105 stores the information locally, encodes the information into a message according to the IGP implemented by the network 100 (e.g., IS-IS, OSPFv2, or OSPFv3), and transmits the information to neighboring NEs 104 and 106. Subsequently, NE 104 stores the information locally and forwards the information to neighboring NE 109, and NE 106 stores the information locally and forwards the information to neighboring NEs 107 and 112. NEs 107, 109, and 112 each similarly store the information and forward the information to the neighboring NEs 104-112, and so on. In this manner, after NE 105 receives the information, the information is encoded according to the IGP and flooded to all the NEs 104-112 in the network 100.

The overall amount of information that needs to be flooded through a network 100 using the IGP is continuously growing, which results in an inefficient use of the resources within a network 100. In addition, network characteristics, such as bandwidth, throughput, latency, error rate, etc., can be significantly affected when large amounts of data are flooded through the network 100 using the IGP. For example, networks 100 that implement PPR graphs may forward PPR graph type-length-values (TLVs) that describe each of the PPRs in a PPR graph to every single NE 104-112 in the network 100. In addition, the encoding of the PPR graph includes PPR-Path Description Elements (PPR-PDEs) for each element on each of the PPRs, which typically carries a large amount of data.

However, certain IGPs impose limits as to how much data can be transmitted in a single message or TLV. For example, when the network 100 implements IS-IS as the IGP, the link state information is advertised across the network 100 using a link state packet (LSP), which contains various types of TLVs used to carry different types of link or node related information. Each TLV in an LSP is limited to 255 bytes (1 octet). Additional information regarding IS-IS is described in the Network Working Group RFC 1195, entitled "Use of OSI IS-IS for Routing in TCP/IP and Dual Environments," dated December 1990, by R. Callon.

Similarly, when the network 100 implements OSPFv2 or OSPFv3, link state information is advertised across the network 100 using various types of LSAs, each of which may carry various TLVs. Each TLV in an LSA may be limited to 64,000 bytes (2 octets). Additional information regarding OSPFv2 is described in the Network Working Group RFC 2328, entitled "OSPF Version 2," dated April 1998, by J. Moy. Additional information regarding OSPFv3 is described in the Network Working Group RFC 5340, entitled "OSPF for IPv6," dated July 2008, by R. Colton, et. al. Therefore, the management of data transmission through a network using an IGP is becoming increasingly difficult.

Disclosed herein are embodiments directed to an enhanced protocol for compressing data that is forwarded through the network using an IGP. In an embodiment, each of the NEs 104-112 receives a message comprising a header and data that is to be compressed. The header includes a length of the data prior to compressing the data, a length of the data after compressing the data, and a compression identifier. The NE 104-112 receiving the message is configured to compress the data based on a compression scheme identified by the compression identifier to obtain compressed data. The NE 104-112 then forwards a compressed message including the header and the compressed data to other NEs 104-112 in the network 100.

In some embodiments, the network 100 is configured to implement either a stateless compression scheme or a stateful compression scheme. In a stateless compression scheme, each of the NEs 104-112 is configured to compress the data based on the compression identifier carried in the header of the message, without regard to any data that has been previously transmitted through the network. In this embodiment, instructions corresponding to various different compression schemes are pre-configured or already stored at each of the NEs 104-112. When the message is received by the NE 104-112, the NE 104-112 automatically executes the instructions corresponding to the compression scheme identified by the compression identifier in the message to compress the data in the message and generate a compressed message. The NE 104-112 forwards the compressed message to neighboring NEs 104-112 based on the underlying IGP implemented by the network.

In a stateful compression scheme, one or more of the NEs 104-112 is designated as a compression controller of the network 100. For example, as shown by FIG. 1, NE 104 (shown with a box) can be designated as the compression controller (hereinafter referred to as the "compression controller 104") of the network 100. In one embodiment, multiple candidate compression controllers may transmit an advertisement describing the respective candidate compression controller through the network 100. A candidate compression controller may be pre-configured by an operator of the network 100 or determined based on pre-configured information at each of the NEs 104-112. For example, when NEs 104 and 105 are the candidate compression controllers for the network 100, NEs 104 and 105 flood the network 100 with an advertisement carrying information describing the respective NE 104 and NE 105. The advertisement describing NE 104 may carry, for example, an IP address of NE 104 and/or a pre-configured priority of NE 104. Similarly, the advertisement describing NE 105 may carry, for example, an IP address of NE 105 and/or a pre-configured priority of NE 105.

After all the NEs 104-112 in the network 100 receive the advertisements for NEs 104 and 105, each of the NEs 104-112 may automatically determine the compression controller 104 based on the information carried in the advertisement. For example, each of the NEs 104-112 are pre-configured to select the candidate compression controller having the highest IP address or the highest priority as the compression controller 104 for the network 100. In this case, when NE 104 has the highest IP address among the other candidate compression controllers, each of the other NEs 104-112 in the network 100 determines that the NE 104 is the compression controller 104 of the network 100. When NE 104 has the highest pre-configured priority among the other candidate compression controllers, each of the other NEs 104-112 in the network 100 determines that the NE 104 is the compression controller 104 of the network 100.

In an embodiment, the compression controller 104 monitors uncompressed messages that are being forwarded through the network 100 to determine one or more dictionaries that are to be used to compress data forwarded through the network 100. For example, the compression controller 104 monitors the uncompressed messages that are being forward through the network 100 to determine that 80% of the traffic being forwarded carries an IPv6 address having the same 48-bit prefix. In this case, the compression controller 104 determines that the 48-bit prefix is an uncompressed bit string that can be compressed into a codeword, which may be 4 bits or less. The compression controller 104 generates and stores a dictionary that includes a mapping of the uncompressed bit string (48-bit prefix) to the codeword.

In an embodiment, the compression controller 104 may identify multiple uncompressed bit strings that have a high rate of occurrence in the traffic that is being forwarded through the network 100. In these embodiments, the compression controller 104 determines a codeword for each of the uncompressed bit strings that have a high rate of occurrence in the traffic. The compression controller 104 then adds a mapping between the uncompressed bit string and the codeword to the dictionary.

In an embodiment, the compression controller 104 generates and stores multiple different dictionaries. In each of the different dictionaries, the same uncompressed bit string may be mapped to different codewords or the same codeword. Each of the different dictionaries stores one or more mappings associating an uncompressed bit string with a corresponding codeword.

In an embodiment, the compression controller 104 determines and stores a dictionary identifier identifying the dictionary. Each dictionary may be associated with a unique dictionary identifier. The dictionary identifier may be an alphanumeric value or bit string uniquely identifying the dictionary.

After generating and storing the dictionary and the dictionary identifier, the compression controller 104 forwards the dictionary and the dictionary identifier through the network 100. As described above, the compression controller 104 forwards the dictionary and the dictionary identifier to neighboring NEs 105 and 106, NEs 105 and 106 forward the dictionary and the dictionary identifier to neighboring NEs 106, 109, and 112, and so on.

Each of the receiving NEs 104-112 stores the dictionary and dictionary identifier locally in a memory of the receiving NE 104-112 for use in compressing data at a subsequent time. In an embodiment, each of the receiving NEs 104-112 waits a predetermined buffer time before beginning to compress data based on the dictionary and dictionary identifier. This predetermined buffer time helps ensure that all the other NEs 104-112 have stored the dictionary and dictionary identifier before the NEs 104-112 begin compressing data based on the dictionary and dictionary identifier.

Subsequently, one of the NEs 104-112 may receive a message, either from the central entity 103 or an external client, including information that is to be flooded through the network 100. In an embodiment, the message may include a header that includes the dictionary identifier identifying the dictionary to be used to compress data in the message. In this embodiment, the NE 104-112 compresses the data in the message using the dictionary by replacing the uncompressed bit strings in the data with the corresponding codeword defined by the mappings in the dictionary to obtain compressed data. After which the NE 104-112 forwards a compressed message including the compressed data through the network 100.

In an embodiment, the message received by the NE 104-112 does not include the header but only includes the data to be compressed. In this case, the NE 104-112 may determine a dictionary to use for compressing the data based on the mappings in the dictionary. In an embodiment, NE 104-112 scans the data in the message to determine a number of uncompressed bit strings that match the uncompressed bit strings stored in each of the dictionaries. NE 104-112 determines a dictionary having a highest number of matching uncompressed bit strings identified in the message. In another embodiment, NEs 104-112 may be configured to use certain dictionaries for messages carrying different types of data or different TLVs. In another embodiment, NEs 104-112 may be configured to use a dictionary by default for all messages that are received that do not include a dictionary identifier.

After determining a dictionary to use for the message that does not include a header, the NE 104-112 adds a header to the message, in which the header carries a dictionary identifier corresponding to the dictionary that was determined for the message. In an embodiment, the header also carries a length of the data prior to compressing the data, a length of the data after compression, a type of the data, and/or any other information describing the message before and/or after compression.

Once the header has been added to the message, the NE 104-112 compresses the message based on the dictionary that has been determined for the message. The NE 104-112 compresses the data in the message using the dictionary by replacing the uncompressed bit strings in the data with the corresponding codeword defined by the mappings in the dictionary to obtain compressed data. The NE 104-112 creates a compressed message, in which the compressed message includes the header and the compressed data. The NE 104-112 transmits the compressed message to the neighboring NEs 104-112 to flood the network 100 with the compressed message.

Another NE 104-112 receiving the compressed message may decompress the message based on the dictionary identifier carried in the header of the compressed message. The NE 104-112 receiving the message has the dictionary identifier and the dictionary stored locally in a memory of the NE 104-112. The NE 104-112 uses the locally stored dictionary corresponding to the dictionary identifier to determine the uncompressed bit strings corresponding to the codewords included in the compressed data to decompress the compressed data and obtain the data.

After performing decompression on the compressed data to obtain the data, the NE 104-112 may validate the data by determining that the length of the data after decompression matches the length of the data prior to compression, both of which included in the header of the message. If the length of the data after decompression does not match the length of the data prior to compression, the NE 104-112 may discard the message. If the length of the data after decompression matches the length of the data prior to compression, the NE 104-112 updates a local forwarding table and/or the LSDB to include the data carried in the message before continuing to forward the compressed message through the network 100.

The embodiments disclosed herein are advantageous in that the network overhead can be significantly reduced by compressing the data that is to be forwarded through the network 100 and saved at every single NE 104-112 in the network 100. For example, by compressing the data and reducing the amount of data transmitted through the network 100, the network 100 inherently will have more bandwidth by which to transmit additional data, and throughput of the network 100 can be significantly increased. In addition, latency can be reduced due to the higher availability of network resources within the network 100. In addition, the delay occurring between receiving packets/messages at a line card of each of the NEs 104-112 and being processed at the socket at each of the NEs 104-112 can also be greatly reduced by compressing the data. Accordingly, the embodiments disclosed herein enhance the IGP to provide a more efficient and resource effective manner by which to flood the network 100 with necessary information.

Figure 2:
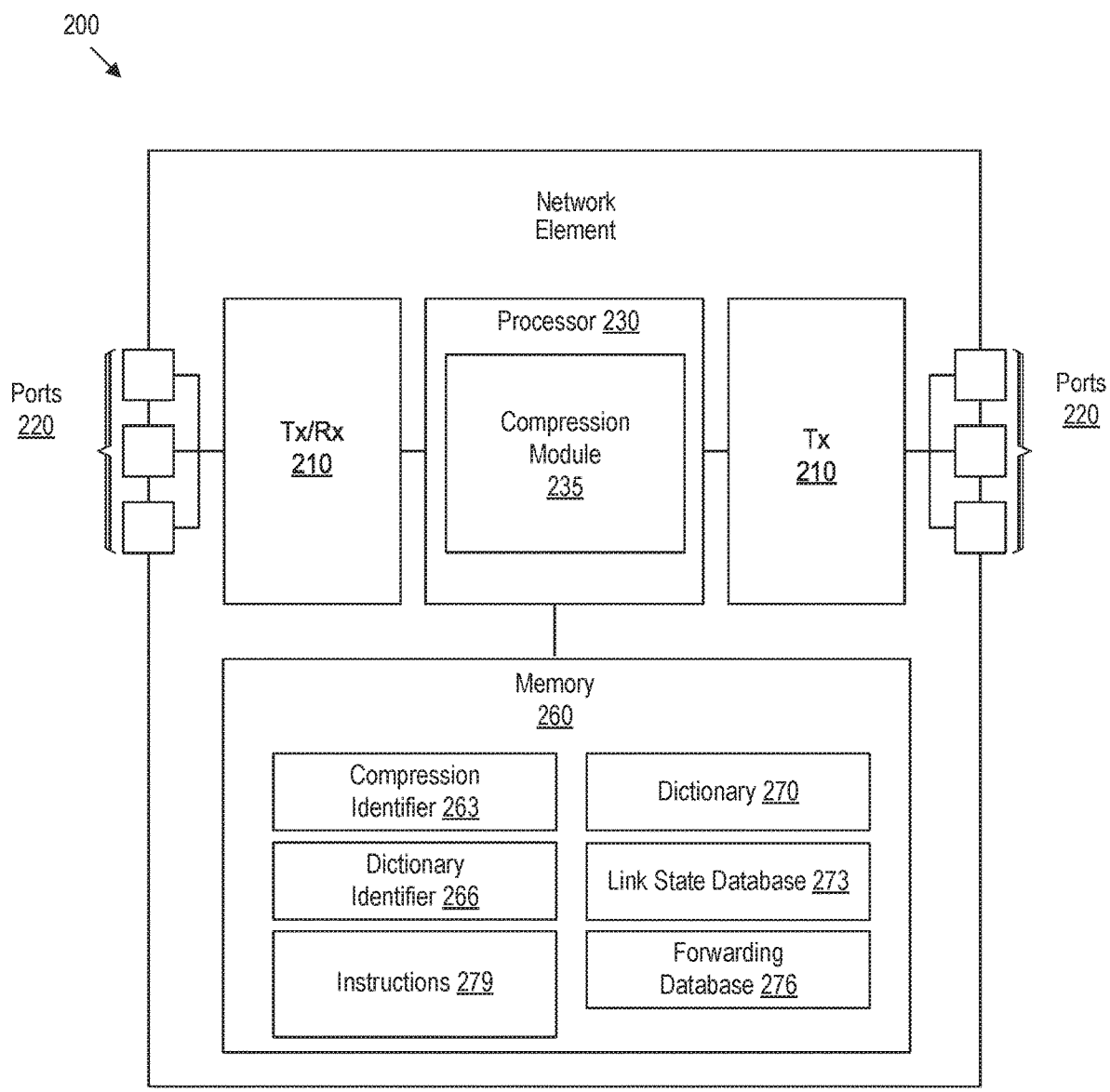
FIG. 2 is a schematic diagram of an NE suitable for compressing data to be encoded using IGP according to various embodiments of the disclosure.

FIG. 2 is a schematic diagram of an NE 200 suitable for compressing data to be encoded using IGP according to various embodiments of the disclosure. In an embodiment, the NE 200 may be implemented as any one of NEs 104-112 or the central entity 103.

The NE 200 comprises ports 220, transceiver units (Tx/Rx) 210, a processor 230, and a memory 260. The processor 230 comprises a compression module 235. Ports 220 are coupled to Tx/Rx 210, which may be transmitters, receivers, or combinations thereof. The Tx/Rx 210 may transmit and receive data via the ports 220. Processor 230 is configured to process data. Memory 260 is configured to store data and instructions for implementing embodiments described herein. The NE 200 may also comprise electrical-to-optical (EO) components and optical-to-electrical (OE) components coupled to the ports 220 and Tx/Rx 210 for receiving and transmitting electrical signals and optical signals.

The processor 230 may be implemented by hardware and software. The processor 230 may be implemented as one or more central processing unit (CPU) and/or graphics processing unit (GPU) chips, logic units, cores (e.g., as a multi-core processor), field-programmable gate arrays (FPGAs), application specific integrated circuits (ASICs), and digital signal processors (DSPs). The processor 230 is in communication with the ports 220, Tx/Rx 210, and memory 260. The compression module 235 is implemented by the processor 230 to execute the instructions for implementing various embodiments discussed herein. For example, the compression module 235 is configured to create a dictionary for use in compressing data to be encoded using an IGP and forwarded through the network 100. The compression module 235 is also configured to compress data according to a compression identifier and/or a dictionary and decompress the data according to the compression identifier and/or the dictionary. The inclusion of the compression module 235 provides an improvement to the functionality of the NE 200. The compression module 235 also effects a transformation of NE 200 to a different state. Alternatively, the compression module 235 is implemented as instructions stored in the memory 260.

The memory 260 comprises one or more of disks, tape drives, or solid-state drives and may be used as an over-flow data storage device, to store programs when such programs are selected for execution, and to store instructions and data that are read during program execution. The memory 260 may be volatile and non-volatile and may be read-only memory (ROM), random-access memory (RAM), ternary content-addressable memory (TCAM), and static random-access memory (SRAM).

In an embodiment, the memory 260 is configured to store a compression identifier 263, dictionary identifier 266, dictionary 270, LSDB 273, forwarding database 276, and/or instructions 279 for compression schemes. The compression identifier 263 is an identifier of a compression scheme that should be used for decompressing data in a message. The compression identifier 263 may uniquely identify pre-configured compression schemes. The pre-configured compression schemes may include any compression scheme that can be performed by NE 200, such as, for example, the deflate compression scheme (as described in the Network Working Group RFC 1951, entitled "DEFLATE Compressed Data Formal Specification version 1.3," dated May 1996, by P. Deutsch), the LZS compression scheme (as described in the Network Working Group RFC 2395, entitled "IP Payload Compressing Using LZS," dated October 1998, by R. Friend, et. al.), the ITU-T V.44 compression scheme (as described by the Network Working Group, RFC 3051, entitled "IP Payload Compression Using IT-T V.44 Packet Method," dated January 2001, by J. Heath, et. al.), and/or any other compression scheme. The instructions 279 for compression schemes include logic or code that can be executed for each of the pre-configured compression schemes that can be performed by the NE 200. The dictionary identifier 266 is a value uniquely identifying the dictionary 270, which stores mappings between uncompressed bit strings and corresponding codewords. The LSDB 273 stores information describing a network topology of network 100. The forwarding database 276 includes routing information describing a next hop to every destination in the network 100 from the NE 200.

It is understood that by programming and/or loading executable instructions onto the NE 200, at least one of the processor 230 and/or memory 260 are changed, transforming the NE 200 in part into a particular machine or apparatus, e.g., a multi-core forwarding architecture, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may be developed and tested in a software form and later transformed, by well-known design rules, to an equivalent hardware implementation in an ASIC that hardwires the instructions of the software. In the same manner as a machine controlled by a new ASIC is a particular machine or apparatus, likewise a computer that has been programmed and/or loaded with executable instructions may be viewed as a particular machine or apparatus.

Figure 3:
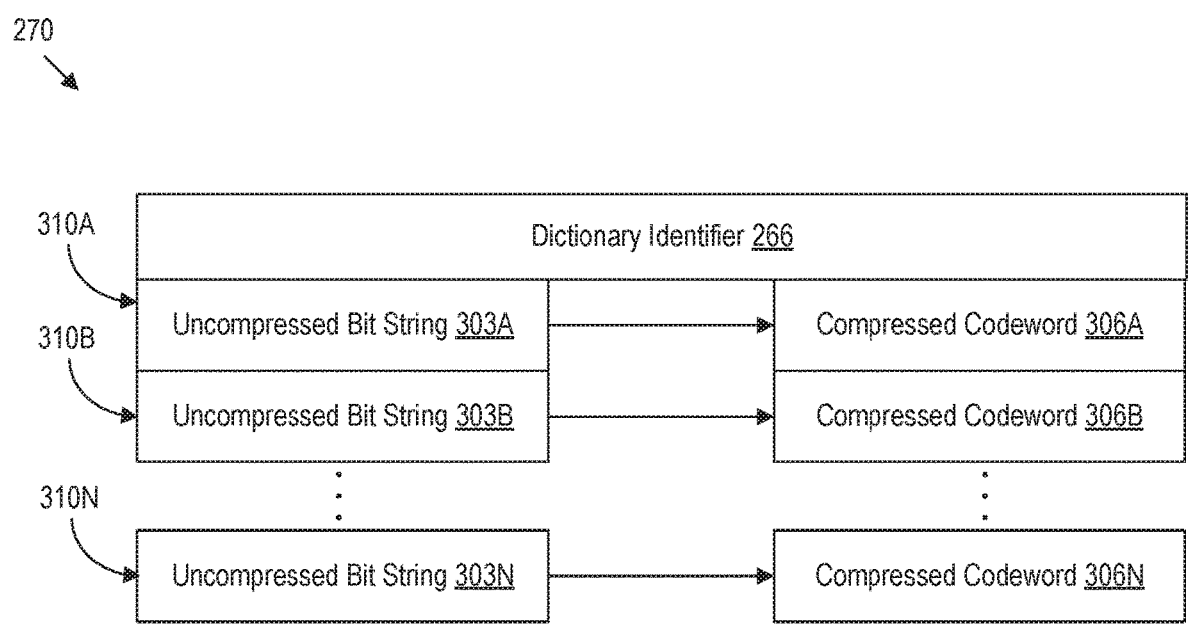
FIG. 3 is a diagram illustrating a dictionary to be used for compressing data in a message according to various embodiments of the disclosure.

FIG. 3 is a diagram illustrating a dictionary 270 to be used for compressing data in a message according to various embodiments of the disclosure. The dictionary 270 corresponds to the dictionary identifier 266, which, as described above, uniquely identifies the dictionary 270. The dictionary 270 includes multiple mappings 310A-N. Each mapping 310A-N describes an association between an uncompressed bit string 303A-N to a compressed codeword 306A-N.

In an embodiment, the compression controller 104 may identify multiple uncompressed bit strings 303A-N that have a high rate of occurrence in the traffic that is being forwarded through the network 100. In this embodiment, the compression controller 104 creates a mapping 310A-N for each of the uncompressed bit strings 303A-N, in which each mapping 310A-N defines an association between the uncompressed bit string 303A-N and the compressed codeword 306A-N.

Similar to the example described above with reference to FIG. 1, the compression controller 104 may monitor the uncompressed messages that are being forwarded through the network 100 to determine that 80% of the traffic being forwarded carries an IPv6 address having the same 48-bit prefix. In this case, the compression controller 104 may determine that the 48-bit prefix is an uncompressed bit string 303A that can be compressed into a codeword 306A, which may be 4 bits or less. The compression controller 104 generates and stores a dictionary 270 that includes a mapping 310A of the uncompressed bit string 303A (48-bit prefix) to the codeword 306A.

In an embodiment, the compression controller 104 generates and stores multiple different dictionaries 270. In the different dictionaries 270, an uncompressed bit string 303A-N may be mapped to different codewords 306A-N.

Each of the different dictionaries 270 stores one or more mappings 310A-N that associates an uncompressed bit string 303A-N with a corresponding codeword 306A-N.

Figure 4A:
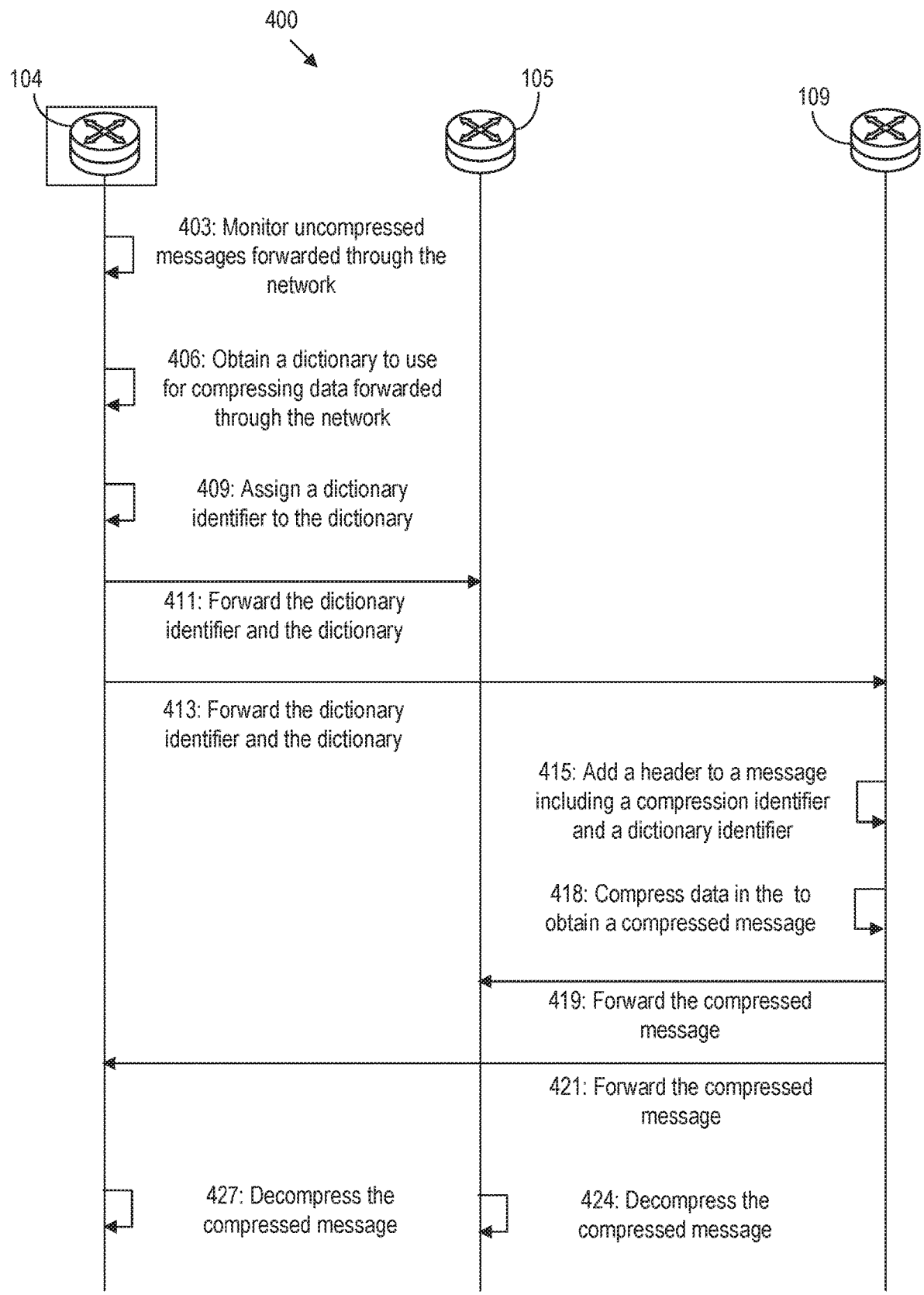
FIGS. 4A-B are message sequence diagrams illustrating methods of performing compression and decompression on data in messages according to various embodiments of the disclosure.
Figure 4B:
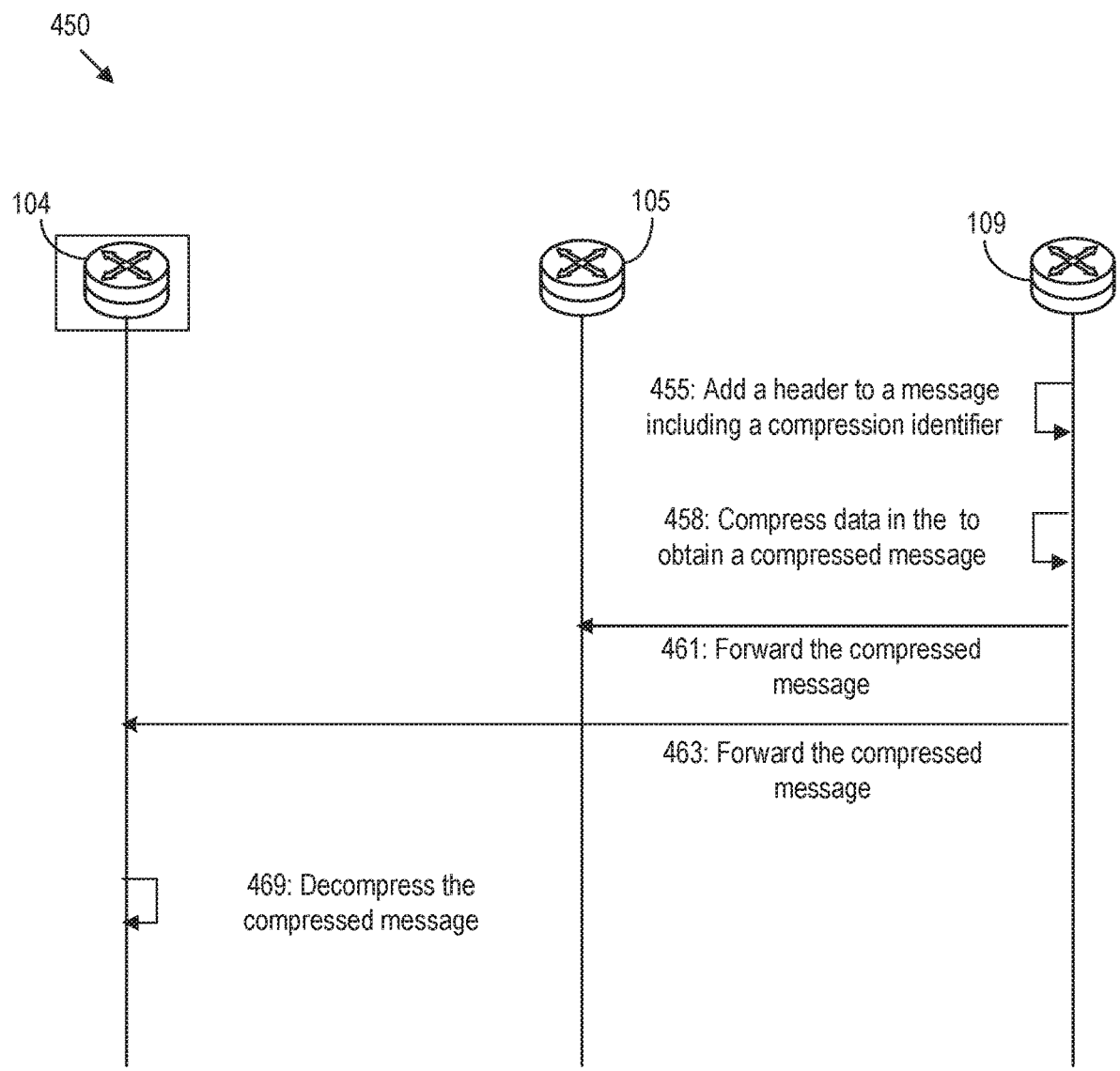

FIGS. 4A-B are message sequence diagrams illustrating methods 400 and 450 of performing compression and decompression on data in messages according to various embodiments of the disclosure. In particular, FIG. 4A is a message sequence diagram illustrating a method 400 of performing compression and decompression on data in messages according to a stateful compression scheme. FIG. 4B is a message sequence diagram illustrating a method 450 of performing compression and decompression on data in messages according to a stateless compression scheme.

Referring now to FIG. 4A, the method 400 is performed by NE 104 (referred to with regard to FIG. 4A as the compression controller 104), NE 105, and NE 109. The compression controller 104 is communicatively coupled to NE 105 and NE 109. The method 400 is performed to implement a stateful compression scheme, which refers to a compression scheme that relies upon a compression controller 104 that defines dictionaries 270, which are forwarded to all the NEs 104-112 in the network 100 and used for compressing data.

At step 403, the compression controller 104 monitors uncompressed messages that are being forwarded through the network 100. For example, NEs 104-112 in network 100 may constantly be forwarding messages carrying information (topology and/or routing information) that are saved by each of the NEs 104-112 in the network 100. The compression controller 104 may not only save the information received in each of these messages, but also monitor and analyze the bit strings defined in the message as, for example, TLVs and sub-TLVs, to define a dictionary 270.

In an embodiment, while monitoring the uncompressed messages, the compression controller 104 may identify multiple uncompressed bit strings 303A-N (hereinafter referred to as "uncompressed bit strings 303") that have a high rate of occurrence in the traffic being forwarded through the network 100. In an embodiment, the compression controller 104 determines a count for certain uncompressed bit strings 303 that are frequently included in messages that are forwarded through the network 100. In this embodiment, when the compression controller 104 determines that the count for an uncompressed bit string 303 present in messages being forwarded through the network 100 exceeds a threshold within a predetermined period of time, the compression controller 104 generates a corresponding codeword 306A-N (herein after referred to as "codeword 306") for the uncompressed bit string 303.

In one embodiment, the compression controller 104 determines a percentage that an uncompressed bit string 303 is present in the traffic being forwarded through the network 100. In this embodiment, the compression controller 104 generates a corresponding codeword 306 for the uncompressed bit strings 303 having a percentage higher than a preset threshold.

At step 406, the compression controller 104 obtains, or generates, a dictionary 270 to use for compressing data forwarded through the network 100. The dictionary 270 includes the mappings 310 between the uncompressed bit strings 303 and the corresponding codewords 306. At step 409, the compression controller 104 assigns a dictionary identifier 266 to the dictionary 270 obtained at step 406. The compression controller 104 also stores the dictionary 270 and the dictionary identifier 266 locally in the memory 260.

At step 411, the compression controller 104 forwards the dictionary 270 and the dictionary identifier 266 to the neighboring NE 105. Similarly, at step 413, the compression controller 104 forwards the dictionary 270 and the dictionary identifier 266 to the other neighboring NE 109.

After receiving the dictionary 270 and the dictionary identifier 266 from the compression controller 104, NE 105 and NE 109 are configured to wait a predetermined buffer time before beginning to use the dictionary 270 and the dictionary identifier 266 to compress data. When a message is received by the NE 109 after receiving the dictionary 270 and the dictionary identifier 266 and waiting the predetermined buffer time, NE 109 may determine that the message includes data that should be compressed based on a particular dictionary 270. In the case where the message does not include a header, at step 415, NE 109 adds a header including a dictionary identifier 266 identifying the dictionary 270 and a compression identifier 263 identifying that the stateful compression should be implemented. In an embodiment, the header may also include the length of the message prior to compressing the data and the length of the message after compressing the data.

At step 418, NE 109 compresses the data based on the compression identifier 263, the dictionary identifier 266, and the dictionary 270 corresponding to the dictionary identifier 266 to obtain compressed data. NE 109 compresses the data in the message by translating the uncompressed bit strings 303 identified in the data of the message into the corresponding codeword 306, as defined by the mappings 310 of the dictionary 270. NE 109 obtains, or creates, a compressed message including the header and the compressed data, and forwards the compressed message to neighboring NEs 105 and 104, at steps 419 and 421, respectively.

As should be appreciated, after receiving the dictionary identifier 266 and the dictionary 270 from the compression controller 104 and receiving a message for compression, NE 105 may also perform steps 415 and 418 to create a compressed message. NE 105 may also forward the compressed message to neighboring NEs 106 and 104.

In some cases, NE 109 may also receive a compressed message including a header and compressed data from another neighboring NE 105. In this case, at step 424, NE 109 decompresses the data based on the compression identifier 263 and the dictionary identifier 266 carried in the header of the compressed message to obtain the original data in the original message. NE 109 may first determine a dictionary 270 corresponding to the dictionary identifier 266 carried in the header of the compressed message. NE 109 may then determine the codewords 306 that are in the compressed data of the compressed message, and then translate the codewords 306 to the uncompressed bit strings 303 identified in the mappings 310 of the dictionary 270. In an embodiment, NE 109 may validate the message after decompression by ensuring that the length of the message after compression matches the length of the message prior to compressing the data carried in the header of compressed message. In an embodiment, the NE 109 stores the data after decompressing the data in either the LSDB 273 or the forwarding database 276, depending on the type of data in the message. At step 427, the compression controller 104 performs similar steps to decompress the compressed message, validate the data, and store the data.

Referring now to FIG. 4B, the method 450 is performed by NE 104, NE 105, and NE 109. The method 450 is performed to implement a stateless compression scheme, which refers to a pre-configured compression scheme that is stored as instructions 279 at each of the NEs 104-112 in the network 100.

NE 109 receives a message from another NE 104-108 or 110-112 in the network 100. In an embodiment, NE 109 determines that the message includes data that should be compressed before being forwarded through the network 100, but the message does not include a header. In this embodiment, at step 455, NE 109 adds a header to the message, in which the header carries a compression identifier 263 corresponding to a compression scheme for which instructions 279 are stored locally at each of the NEs 104-112 in the network 100. For example, the NE 109 may add a compression identifier 263 corresponding to a default compression scheme that should be used to compress the data in the message. In an embodiment, the header may also include the length of the message prior to compressing the data and the length of the message after compressing the data.

In another embodiment, the message includes a header carrying a compression identifier 263. In either case, at step 458, NE 109 compresses the data in the message based on the instructions 279 corresponding to the compression scheme identified by the compression identifier 263 to obtain compressed data. NE 109 creates a compressed message including the compressed data and the header. NE 109 forwards the compressed message to neighboring NEs 105 and 104, at steps 461 and 463, respectively.

NE 104 receives the compressed message from NE 109. At step 469, NE 104 decompresses the compressed message based on the compression identifier 263 carried in the header of the compressed message. For example, NE 104 executes the instructions 279 that are pre-configured at all of the NEs 104-112 in the network 100 and that corresponds to the compression scheme identified by the compression identifier 263 to decompress the compressed data in the compressed message and obtain the original message. In an embodiment, NE 104 may validate the message after decompression by ensuring that the length of the message after compression matches the length of the message prior to compressing the data carried in the header of compressed message. In an embodiment, the NE 109 stores the data after decompressing the data in either the LSDB 273 or the forwarding database 276, depending on the type of data in the message. NE 105 may perform similar steps after receiving the compressed message.

Figure 5:
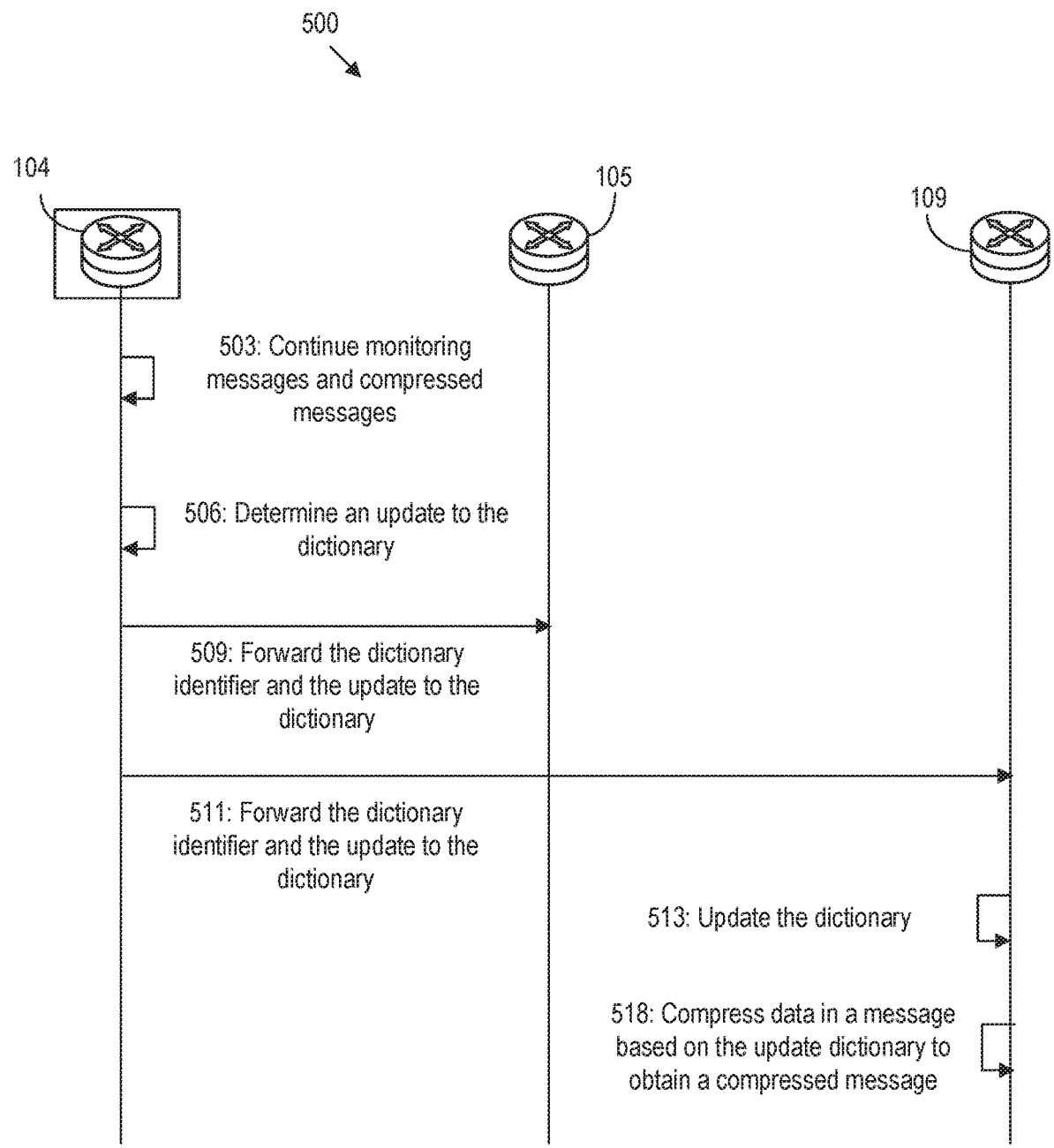
FIG. 5 is a message sequence diagram illustrating a method for updating a dictionary and forwarding the update to the dictionary to other NEs in the network according to various embodiments of the disclosure.

FIG. 5 is a message sequence diagram illustrating a method 500 for updating a dictionary 270 and forwarding the update to the dictionary 270 to other NEs 104-112 in the network 100 according to various embodiments of the disclosure. Method 500 is also performed by neighboring NEs 104, 105, and 109 when the network 100 implements a stateful compression scheme. Method 500 is performed after a dictionary 270 has been created and configured at all the NEs 104-112 in the network 100.

At step 503, the compression controller 104 continues to monitor all traffic (e.g., messages that are not compressed and compressed messages) that are being forwarded through the network 100. This is similar to step 403 of method 400, except that in method 500, the compression controller 104 additionally monitors and examines compressed messages. During this step, the compression controller 104 identifies multiple uncompressed bit strings 303 in both types of messages that have a high rate of occurrence.

Based on the monitoring of these messages, at step 506, the compression controller 104 determines an update to the dictionary 270. For example, the compression controller 104 identifies another uncompressed bit string 303 that frequently occurs in the messages and compressed messages being forwarded through the network 100 and determines a corresponding codeword 306 for the uncompressed bit string 303. The compression controller 104 determines an update to the dictionary 270 including a mapping 310 between the new uncompressed bit string 303 and the corresponding codeword 306 and stores the update to the dictionary 270. The update to the dictionary 270 may refer to an update to an existing mapping 310 of the dictionary 270 or a new mapping 310 defining a new association between an uncompressed bit string 303 and a corresponding codeword 306.

At step 509, NE 104 forwards the dictionary identifier 266 corresponding to the dictionary 270 being updated and the update to the dictionary 270 (e.g., the new mapping 310) to NE 105. Similarly, at step 511, NE 104 forwards the dictionary identifier 266 corresponding to the dictionary 270 being updated and the update to the dictionary 270 to NE 109.

At step 513, NE 109 updates the dictionary 270 to include the new mapping 310 received by NE 109 using the dictionary identifier 266. The new mapping 310 may replace an existing mapping 310 in the locally stored dictionary 270 or be added as a new mapping 310 to the locally stored dictionary. At step 518, NE 109 begins to compress data received in messages based on the update to the dictionary 270 to obtain a compressed message. Step 518 is similar to step 418 of method 400. NE 105 may perform steps similar to steps 513 and 518.

Figure 6:
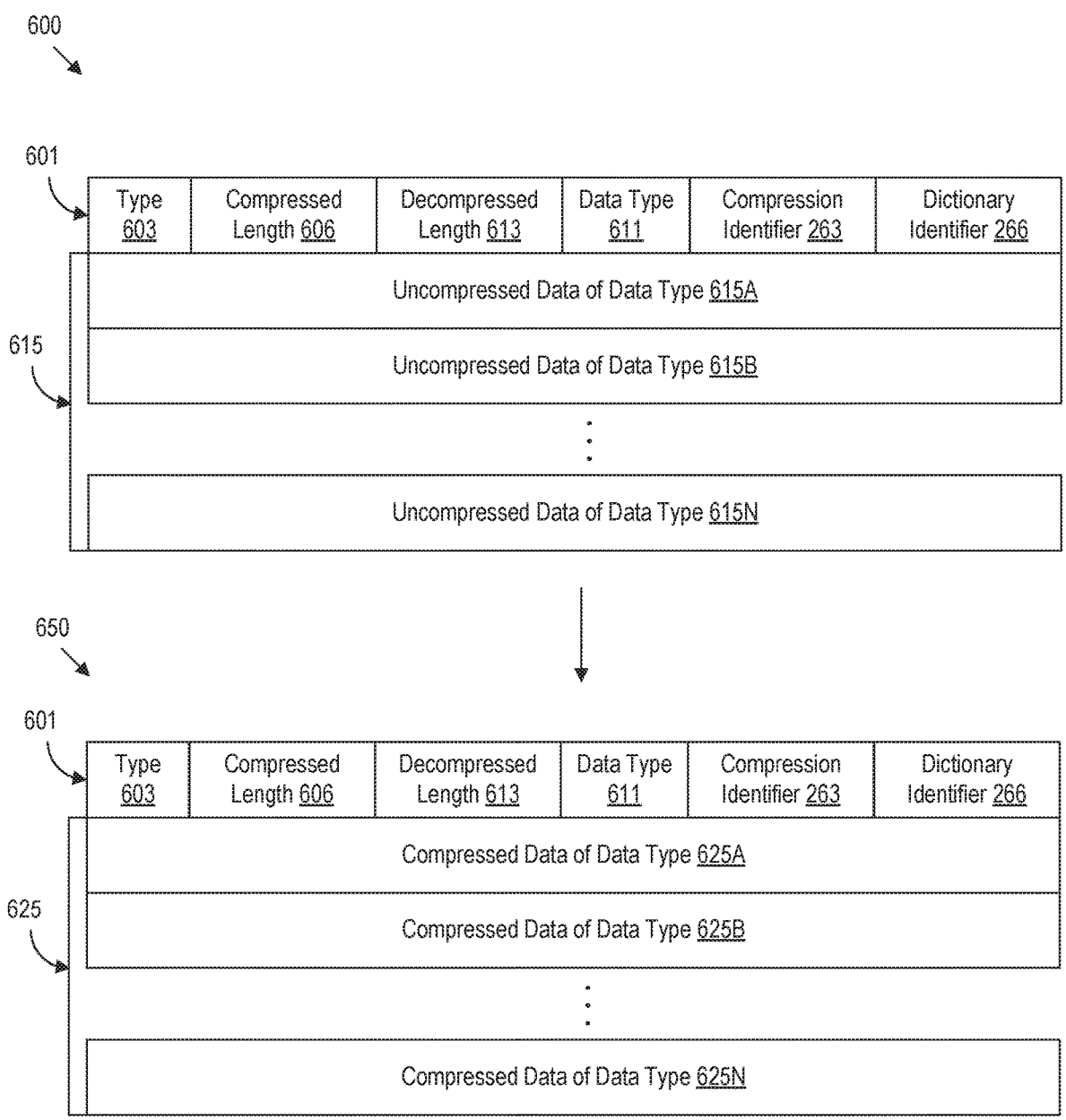
FIG. 6 is a diagram illustrating a message and a compressed message according to various embodiments of the disclosure.

FIG. 6 is a diagram illustrating a message 600 and a compressed message 650 according to various embodiments of the disclosure. In some embodiments, FIG. 6 illustrates an intermediary step performed by an originating NE 104-112 before flooding the compressed message 600 through the network 100. In an embodiment, an originating NE 104-112 first generates the message 600. The NE 104-112 then compresses the data 615 in the message 600 according to a compression identifier 263 and/or a dictionary identifier 266 to form the compressed message 650. The originating NE 104-112 then transmits the compressed message 650 to the other NEs 104-112 in the network 100.

The message 600 includes a header 601 and the data 615 that has not been compressed. In an embodiment, the NE 104-112 receives the message 600 without the header 601 and adds the header 601 to the data 615. In another embodiment, the NE 104-112 receives the message 600 including the header 601.

The header 601 includes a type 603, a compressed length 606, a decompressed length 613, a data type 611, a compression identifier 263, and/or a dictionary identifier 266. As should be appreciated, the header 601 may include other data that may be used to compress and decompress the data 615. The type 603 (also referred to as a TLV type) is a value that indicates that the message 600 should be compressed and/or carries compressed data. The value may be assigned by the Internet assigned numbers authority.

In an embodiment, the compressed length 606 (also referred to as length) is a length of the message 600 prior to compressing the data 615. In an embodiment, the compressed length 606 is the length of the data 615 prior to compressing the data 615. In an embodiment, the compressed length 606 does not include the length of the header 601.

In an embodiment, the decompressed length 613 (also referred to as original TLV length) is a length of the message 600 after compressing the data 615. In an embodiment, the decompressed length 613 is the data 615 after the data 615 is compressing the data 615. In an embodiment, the decompressed length 613 does not include the length of the header 601.

The data type 611 (also referred to as original TLV type) indicates a type of the data 615. For example, the data type 611 includes a value representing the type of the data 615. In an embodiment, the data type 611 is a value representing a type of TLV included in the data 615. For example, the message 600 may carry multiple PPR-TLVs in the data 615. In this case, the data type 611 is a value representing PPR-TLVs.

The compression identifier 263 (also referred to herein as the "compression algorithm") is an identifier of a compression scheme that should be used to compress and decompress the data 615. In an embodiment, the compression identifier 263 is a value identifying a stateful compression scheme (as illustrated by methods 400 and 500) or a particular type of stateless compression scheme (as illustrated by method 450). For example, the compression identifier 263 may be set to 0 when a stateful compression scheme should be used to compress and decompress the data 615, another compression identifier 263 may be set when a deflate compression scheme should be used to compress and decompress the data 615, another compression identifier 263 may be set when an LZS compression scheme should be used to compress and decompress the data 615, another compression identifier 263 may be set when the ITU-T V.44 compression scheme should be used to compress and decompress the data 615, etc.

The dictionary identifier 266 is an identifier of a dictionary 270 that should be used to compress and decompress the data 615. In an embodiment, the dictionary identifier 266 may only be included in the header 601 when the compression identifier 263 indicates that a stateful compression scheme should be implemented. When the compression identifier 263 indicates that a stateless compression scheme (e.g., any other pre-configured compression scheme) should be implemented, the dictionary identifier 266 may be set to 0 or not included in the header 601.

The data 615 may include any information that should be flooded through a network 100 and encoded according to an IGP (e.g., IS-IS, OSPFv2, or OSPFv3). For example, the data 615 may include topology information received from the central entity 103, another NE 104-112 in the network 100, or an external client that is to be stored at each of the NEs 104-112 in the network 100. The data 615 may also include routing information received from the central entity 103, another NE 104-112 in the network 100, or an external client indicating a next hop to one or more destinations in the network 100 (or outside the network 100). When the data 615 includes routing information, the data 615 may be encoded according to several different types of TLVs, or a particular data type 611. For example, the data 615 may include uncompressed data 615A-N of a data type 611 associated with PPRs, which includes one or more PPR-TLVs describing one or more PPRs that are to be provisioned in the network 100. As another example, the data 615 may include uncompressed data 615A-N of a data type 611 associated with PPR graphs, which includes one or more PPR Graph-TLVs describing one or more PPR graphs that are to be provisioned in the network 100.

After an NE 104-112 compresses the uncompressed data 615A-N (hereinafter referred to as "data 615") in the message 600, the NE 104-112 obtains, or generates, the compressed message 650. The header 601 in the compressed message 650 is the same as the header 601 of the message 600. The compressed message 650 includes the compressed data 625A-N. The NE 104-112 compresses the data 615 to obtain the compressed data 625 based on the compression identifier 263 and/or the dictionary identifier 266 included in the header 601.

The compressed data 625A-N (also referred to herein as "compressed data 625") includes the same information as data 615, except that the compressed data 625 is encoded according to a compression scheme and/or a dictionary 270. For example, if the compression identifier 263 identifies a stateless compression scheme, then the compressed data 625 is encoded according to the stateless compression scheme identified by the compression identifier 263. In this case, the NE 104-112 performs the compression scheme identified by the compression identifier 263 using the instructions 279 corresponding to the compression identifier 263 with the data 615 to output the compressed data 625. If the compression identifier 263 identifies a stateful compression scheme, the compressed data 625 is encoded according to the dictionary 270 corresponding to the dictionary identifier 266 included in the header 601. In this case, the NE 104-112 performs compression based on the dictionary 270 to output the compressed data 625, which is then included in the compressed message 650 instead of the data 615.

Similar to data 615, the compressed data 625 may be encoded according to several different types of TLVs, or a particular data type 611. For example, the compressed data 625 may include compressed data 625A-N of a data type 611 associated with PPRs, which includes one or more compressed PPR-TLVs describing one or more PPRs that are to be provisioned in the network 100. As another example, the compressed data 625 may include compressed data 625A-N of a data type 611 associated with PPR graphs, which includes one or more compressed PPR Graph-TLVs describing one or more PPR graphs that are to be provisioned in the network 100.

Figure 7:
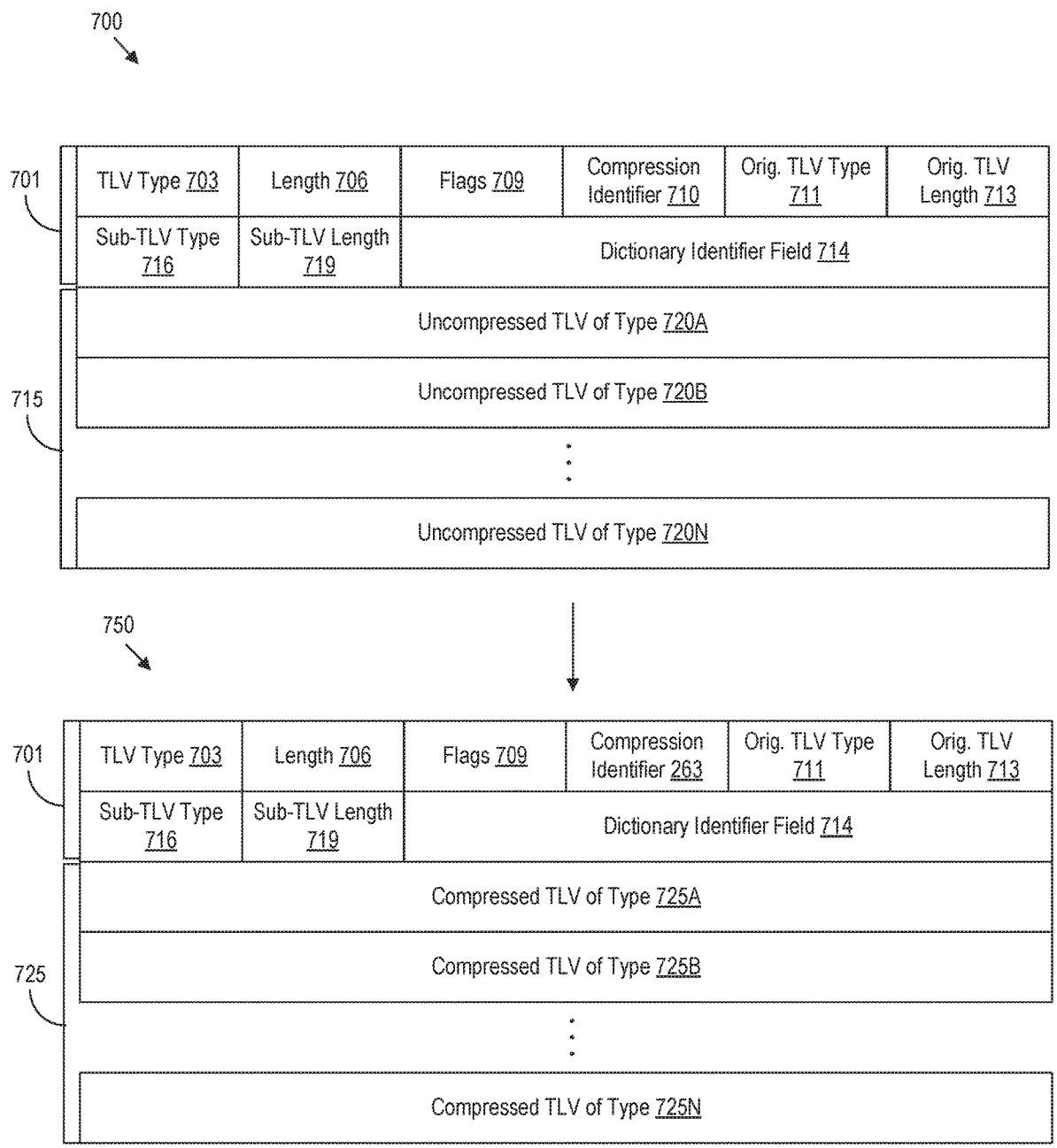
FIG. 7 is a diagram illustrating a message and a compressed message encoded according to Intermediate System-Intermediate System (IS-IS) according to various embodiments of the disclosure.

FIG. 7 is a diagram illustrating a message 700 and a compressed message 750 encoded according to IS-IS according to various embodiments of the disclosure. Message 700 is similar to message 600 (FIG. 6), except that message 700 is encoded according to IS-IS, and as such, includes fields related to IS-IS. Similar to FIG. 6, FIG. 7 illustrates an intermediary step performed by an originating NE 104-112 before flooding the compressed message 750 through the network 100. In an embodiment, an originating NE 104-112 first generates the message 700. The NE 104-112 then compresses the data 715 in the message 700 according to a compression identifier 263 and/or a dictionary identifier 266 to form the compressed message 750. The originating NE 104-112 then transmits the compressed message 750 to the other NEs 104-112 in the network 100.

The message 700 includes a header 701 and the data 715 that has not been compressed. In an embodiment, the NE 104-112 receives the message 700 without the header 701 and adds the header 701 to the data 715. In another embodiment, the NE 104-112 receives the message 700 including the header 701.

The header 701 includes a TLV type field 703, a length field 706, a flags field 709, a compression identifier field 710, an original TLV type field 711, an original TLV length field 713, a sub-TLV type field 716, a sub-TLV length field 719, a dictionary identifier field 714, and multiple uncompressed TLVs 720A-N. The multiple uncompressed TLVs 720A-N carry data 715, which is uncompressed and similar to data 615 (FIG. 6). As should be appreciated, the header 701 may include other fields carrying data 715 that may be used to compress and decompress the data 715.

The TLV type field 703 carries the TLV type 603 (FIG. 6). The length field 706 carries the compressed length 606 (FIG.

6). The flags 709 field carries one or more flags that may be set to a value that is used for compressing or decompressing the data 715. The compression identifier field 710 carries the compression identifier 263 (FIG. 6). The original TLV type field 711 carries the data type (FIG. 6). The original TLV length field 713 carries the decompressed length 613 (FIG. 6). The dictionary identifier field 714 carries the dictionary identifier 266.

When the message 700 contains additional TLVs that are not part of the data type 611 encoded in the original TLV type field 711, the sub-TLV type field 716 carries a value indicating a type of the additional TLVs, and the sub-TLV length field 719 carries a length of the additional TLVs. The sub-TLV type field 716 and the sub-TLV length field 719 are optional fields that may be included in the message 700 when the message 700 includes the additional TLVs. The data 715 is encoded as the uncompressed TLVs 720A-N of the data type 611 carried in the carried in the original TLV type field 711.

After compression is performed on the multiple uncompressed TLVs 720A-N, the compressed message 750 is obtained. The compressed message 750 includes the header 701 and the compressed data 725, encoded as the compressed TLVs 725A-N. The compressed message 750 includes the same header 701 as the message 700. The compressed TLVs 725A-N include the same information as the uncompressed TLVs 720A-N of the data type 611, except the information in the compressed TLVs 725A-N is compressed according to the compression identifier 263 carried in the compression identifier field 710 and/or the dictionary identifier 266 carried in the dictionary identifier field 714.

Figure 8A:
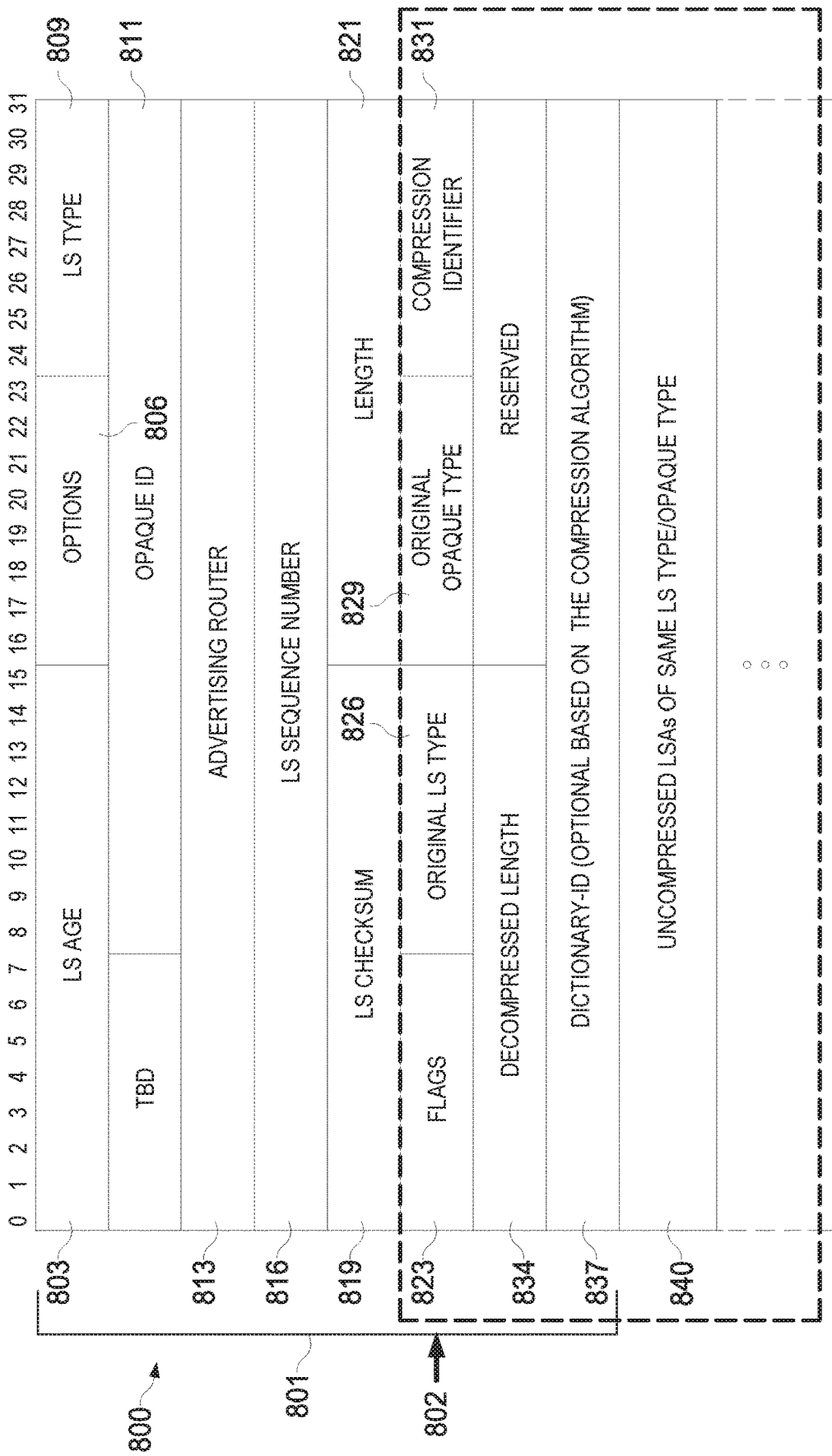
FIGS. 8A-B are diagrams illustrating a message and a compressed message encoded according to Open Shortest Path First (OSPF) Version 2 (OSPFv2) according to various embodiments of the disclosure.
Figure 8B:
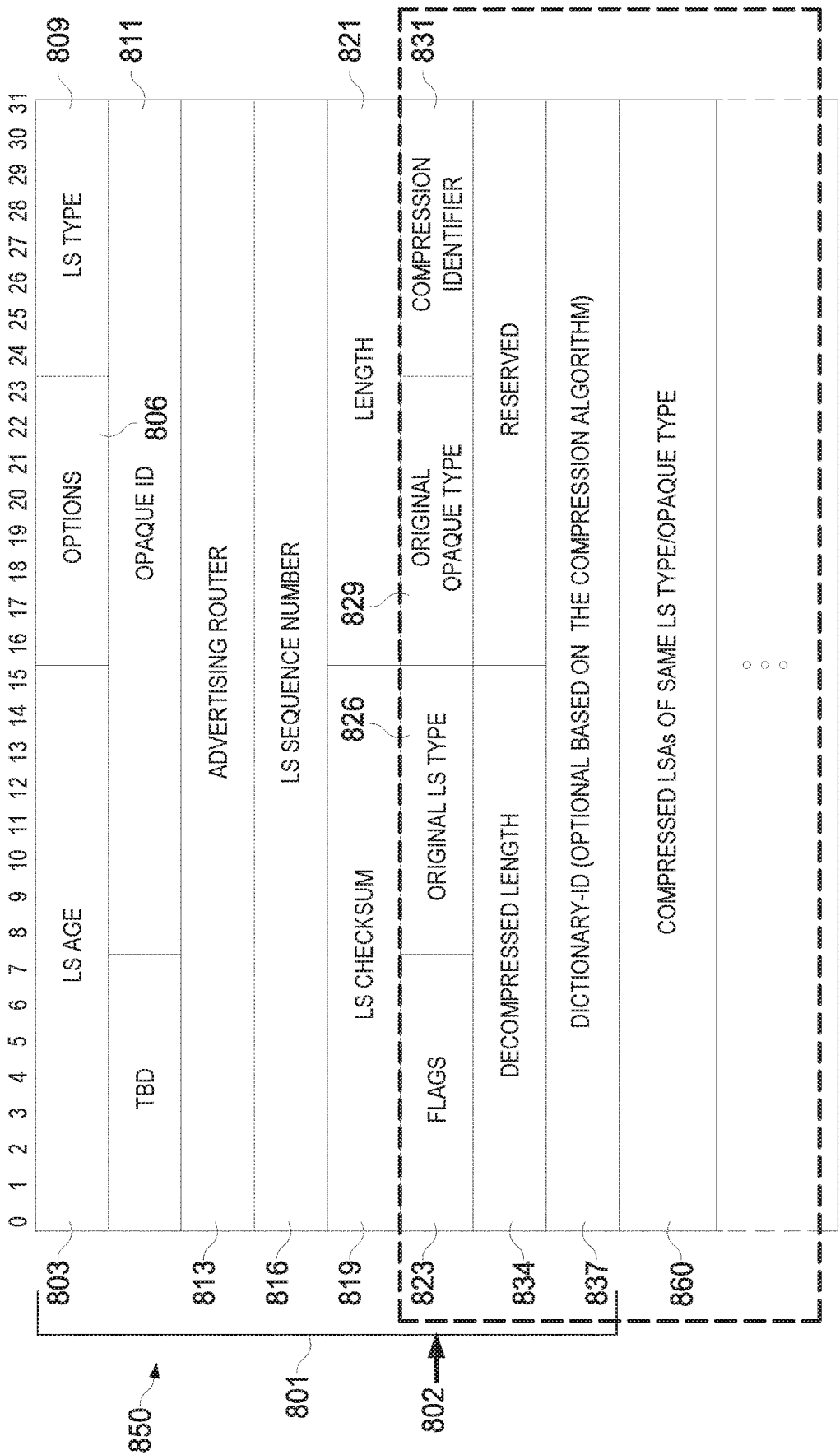

FIGS. 8A-B are diagrams illustrating a message 800 and a compressed message 850 encoded according to OSPF Version 2 (OSPFv2) according to various embodiments of the disclosure. FIG. 8A shows the message 800 and FIG. 8B shows the compressed message 850. Similar to FIGS. 6-7, FIGS. 8A-B illustrate an intermediary step performed by an originating NE 104-112 before flooding the compressed message 850 of FIG. 8B through the network 100. In an embodiment, an originating NE 104-112 first generates the message 800 of FIG. 8A. The NE 104-112 then compresses the data in the message 800 according to a compression identifier 263 and/or a dictionary identifier 266 to form the compressed message 850 of FIG. 8B. The originating NE 104-112 then transmits the compressed message 850 to the other NEs 104-112 in the network 100.

Referring now to FIG. 8A, message 800 is similar to message 600 (FIG. 6), except that message 800 is encoded according to OSPFv2, and as such, includes fields related to OSPFv2. In an embodiment, message 800 is encoded as an LSA according to OSPFv2, and includes new fields 802 that are not described by RFC 7684.

The message 800 includes a header 801 and the uncompressed LSAs 840 that have not been compressed. The header 801 includes an LS age field 803, options 806, an LS type field 809, an opaque identifier field 811, an advertising router field 813, an LS sequence number field 816, an LS checksum field 819, a length field 821, flags 823, an original LS type field 826, an original opaque type field 829, a compression identifier field 831, a decompressed length field 834, and a dictionary identifier field 837. As should be appreciated, the header 801 may include other fields carrying data that may be used to compress and decompress the LSAs. The multiple uncompressed LSAs 840 carry uncompressed data 615 or 715.

The LS age field 803, options 806, LS type field 809, opaque identifier field 811, advertising router field 813, LS sequence number field 816, LS checksum field 819, and length field 821 are described by RFC 7684 as original fields of an OSPFv2 extended prefix opaque LSA. In an embodiment, the length field 821 carries the compressed length 606 (FIG. 6). The new fields 802 of the message includes the flags 823, original LS type field 826, original opaque type field 829, compression identifier field 831, length of uncompressed data field 834, and the dictionary identifier field 837. The flags 823 carry one more flags, or values, indicating information to be used for compressing or decompressing the LSAs 840. The original LS type field 826 carries a checksum computed after forming the complete TLV with the compressed LSAs, as shown in FIG. 8B, and the original opaque type field 829 carries a length of the compressed LSAs, as shown in FIG. 8B. The compression identifier field 831 carries the compression identifier 263. The decompressed length field 834 carries the decompressed length 613 (FIG. 6). The dictionary identifier field 837 carries the dictionary identifier 266, and this field is optional based on the compression identifier 263 carried in the compression identifier field 831. For example, when the compression identifier 263 indicates a stateless compression scheme, the dictionary identifier field 837 may not be included in the header 801. The uncompressed LSAs 840 carry data in the form of one or more LSAs, all of the same data type 611.

Referring now to FIG. 8B, the compressed message 850 is similar to message 650 (FIG. 6), except that the compressed message 850 is encoded according to OSPFv2, and as such, includes fields related to OSPFv2. In an embodiment, message 850 is encoded as an LSA according to OSPFv2. As shown by FIG. 8B, compressed message 850 is similar to message 800 in that compressed message 850 includes all the fields in the header 801. However, the compressed message 850 includes compressed LSAs 860 instead of the uncompressed LSAs 840. The compressed LSAs 860 include the same information as the information in the uncompressed LSAs 840, except that the compressed LSAs 860 are compressed according to a compression scheme identified by the compression identifier 263 carried in the compression identifier field 831 and/or the dictionary identifier 266 carried in the dictionary identifier field 837.

Figure 9A:
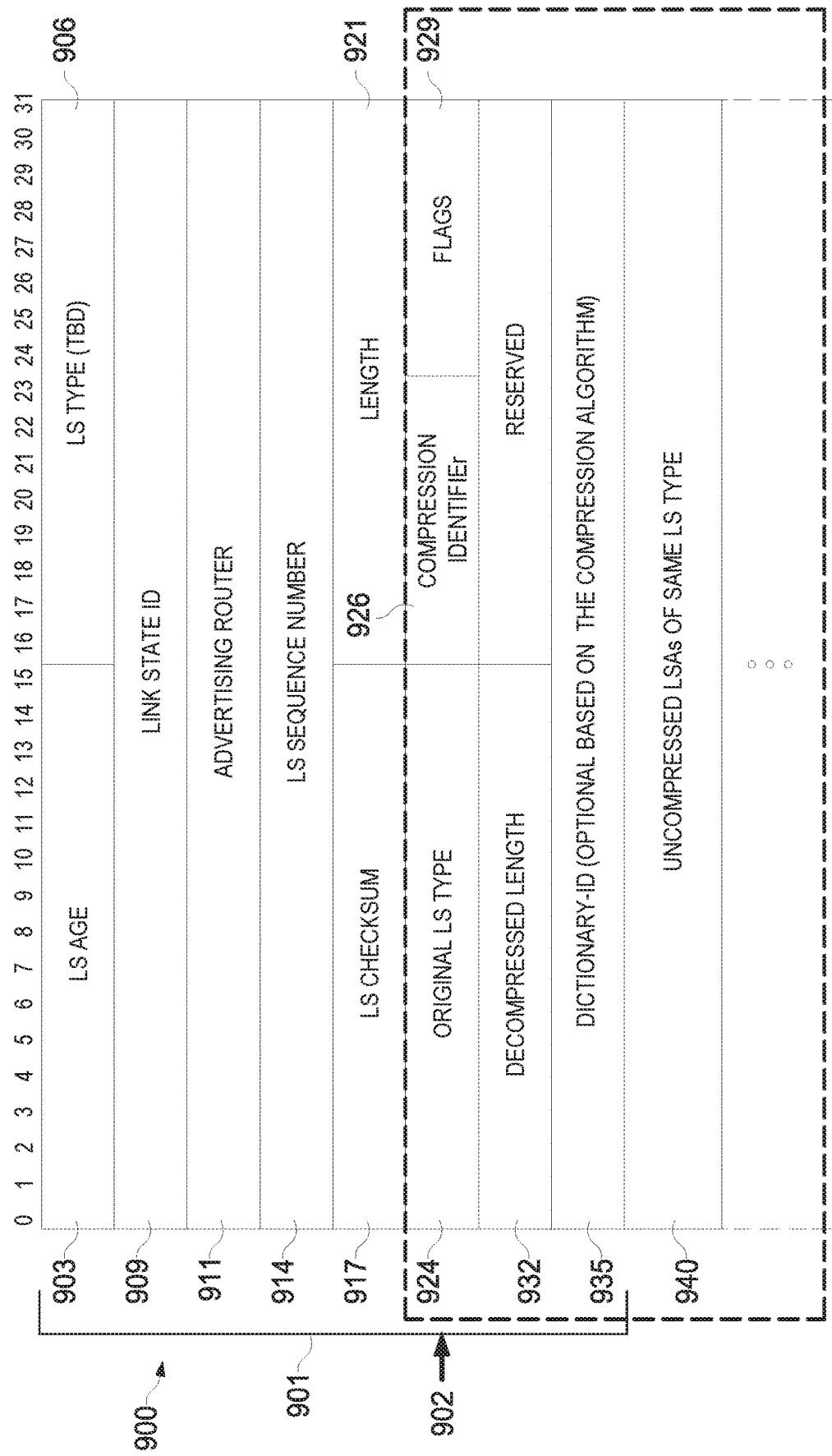
FIGS. 9A-B are diagrams illustrating a message and a compressed message encoded according to OSPF Version 3 (OSPFv3) according to various embodiments of the disclosure.
Figure 9B:
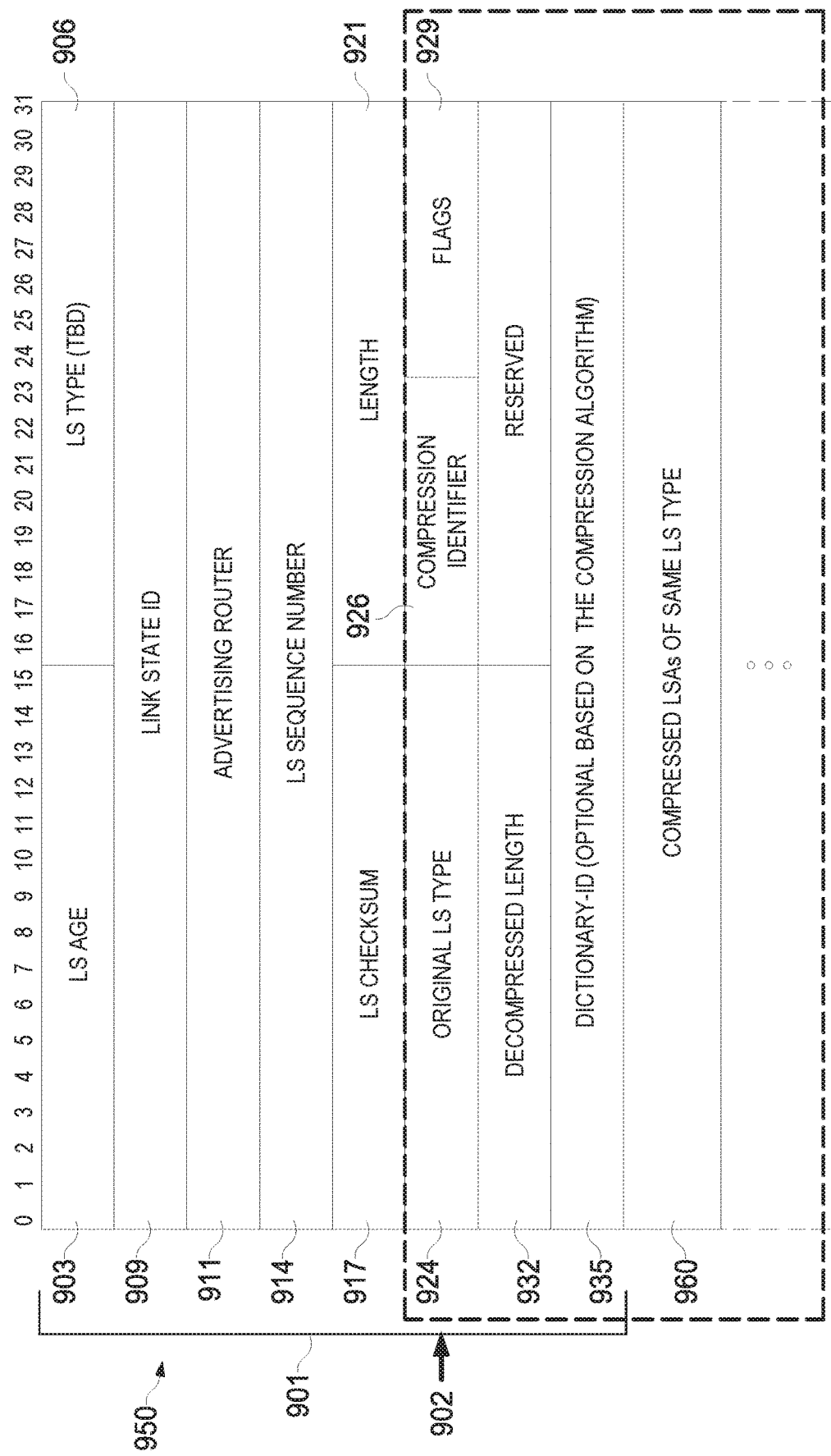

FIGS. 9A-B are diagrams illustrating a message 900 and a compressed message 950 encoded according to OSPF Version 3 (OSPFv3) according to various embodiments of the disclosure. FIG. 9A shows the message 900, and FIG. 9B shows the compressed message 950. Similar to FIGS. 6, 7, and 8A-B, FIGS. 9A-B illustrate an intermediary step performed by an originating NE 104-112 before flooding the compressed message 950 of FIG. 9B through the network 100. In an embodiment, an originating NE 104-112 first generates the message 900 of FIG. 9A. The NE 104-112 then compresses the data in the message 900 according to a compression identifier 263 and/or a dictionary identifier 266 to form the compressed message 950 of FIG. 9B. The originating NE 104-112 then transmits the compressed message 950 to the other NEs 104-112 in the network 100.

Referring now to FIG. 9A, message 900 is similar to message 600 (FIG. 6), except that message 900 is encoded according to OSPFv3, and as such, includes fields related to OSPFv3. In an embodiment, message 900 is encoded as an LSA according to OSPFv3, and includes new fields 902 that are not described by RFC 5340.

The message 900 includes a header 901 and the uncompressed LSAs 940 that have not been compressed. The header 901 includes an LS age field 903, an LS type field 906, an LS identifier field 909, an advertising router field 911, an LS sequence number field 914, an LS checksum field 917, a length field 921, an original LS type field 924, a compression identifier field 926, flags 929, a length of uncompressed data field 932, and a dictionary identifier field 935. As should be appreciated, the header 901 may include other fields carrying data that may be used to compress and decompress the LSAs. The multiple uncompressed LSAs 940 carry uncompressed data 615 or 715.

The LS age field 903, LS type field 906, LS identifier field 909, advertising router field 911, LS sequence number field 914, LS checksum field 917, and length field 921, are described by RFC 5340 as original fields of an OSPFv3 LSA. In an embodiment, the length field 921 carries the compressed length 606 (FIG. 6). The new fields 902 of the message 900 include an original LS type field 924, a compression identifier field 926, flags 929, a length of uncompressed data field 932, and a dictionary identifier field 935. The original LS type field 924 carries the data type 611. The compression identifier field 926 carries the compression identifier 263. The flags 929 carry one more flags, or values, indicating information to be used for compressing or decompressing the LSAs 940. The length of the uncompressed data field 932 carries the decompressed length 613 (FIG. 6). The dictionary identifier field 635 carries the dictionary identifier 266, and this field is optional based on the compression identifier 263 carried in the compression identifier field 926. For example, when the compression identifier 263 indicates a stateless compression scheme, the dictionary identifier field 935 may not be included in the header 901. The uncompressed LSAs 940 carry data in the form of one or more LSAs, all of the same data type 611.

Referring now to FIG. 9B, the compressed message 950 is similar to compressed message 650 (FIG. 6), except that compressed message 950 is encoded according to OSPFv3, and as such, includes fields related to OSPFv3. In an embodiment, compressed message 950 is encoded as an LSA according to OSPFv3. As shown by FIG. 9B, compressed message 950 is similar to message 900 in that compressed message 950 includes all the fields in the header 901. However, the compressed message 950 includes compressed LSAs 960 instead of the uncompressed LSAs 940. The compressed LSAs 960 include the same information as the information in the uncompressed LSAs 940, except that the compressed LSAs 940 are compressed according to a compression scheme identified by the compression identifier 263 carried in the compression identifier field 926 and/or the dictionary identifier 266 carried in the dictionary identifier field 935.

Figure 10:
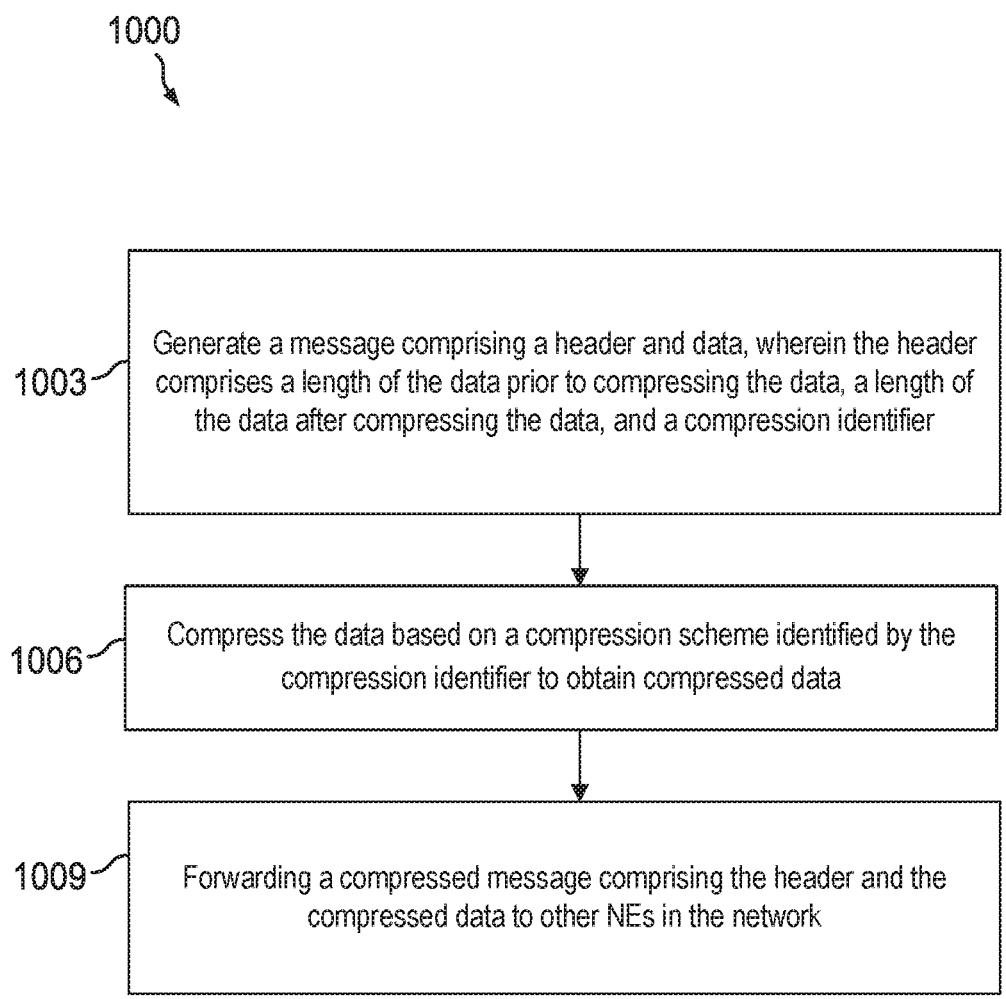
FIG. 10 is a flowchart illustrating a method for compressing data using an IGP according to various embodiments of the disclosure.

FIG. 10 is a flowchart illustrating a method 1000 for compressing data using an IGP according to various embodiments of the disclosure. Method 1000 may be performed by one of the NEs 104-112 in the network 100 or by NE 200 implemented as one of the NEs 104-112. Method 1000 is performed after instructions 279 corresponding to different compression schemes, compression identifiers 263 identifying the different compression schemes, dictionaries 270, and/or dictionary identifiers 266 are pre-stored at each of the NEs 104-112.

At step 1003, one of the NEs 104-112 generates a message comprising a header and data. The message may be similar to the message 600, 700, 800, or 900. The header may be similar to the header 601, 701, 801, or 901. The data may be similar to data 615 or 715 or uncompressed LSAs 840 or 940. In an embodiment, the header comprises a decompressed length 613, which refers to a length of the data prior to compressing the data. The header also comprises a compressed length 606, which refers to a length of the data after compressing the data. The header may also comprise the compression identifier 263. In an embodiment, Tx/Rx 210 receives the message from another NE 104-112 in the network, the central entity 103, or an external device or client.

At step 1006, NE 104-112 compresses the data based on a compression scheme identified by the compression identifier 263 to obtain compressed data, such as the compressed data 625 or 725 or compressed LSAs 840 or 940. For example, the processor 230 executes the compression module 235 to perform compression on the data based on the compression scheme identified by the compression identifier 263.

For example, when the compression identifier 263 identifies a particular stateless compression scheme (e.g., deflate compression scheme, LZS compression scheme, ITU-T V.44 compression scheme, etc.), NE 104-112 searches the memory 260 for instructions 279 corresponding to the stateless compression scheme. NE 104-112 executes the instructions 279 to compress the data and output the compression data. NE 104-112 generates a compressed message, such as message 650, 750, 850, or 950, by replacing the data with the compressed data.

At step 1009, NE 104-112 forwards the compressed message comprising to the header and the compressed data to other NEs 104-112 in the network 100. For example, the Tx/Rx forwards the compressed message to other NEs 104-112 in the network 100 to flood the network 100 with the compressed message.

The NE 104-112 that receives the compressed message decompresses the message based on the compression identifier 263 when the compression identifier 263 indicates a stateless compression scheme. Alternatively, the NE 104-112 that receives the compressed message decompresses the message based on the compression identifier 263 and the dictionary identifier 266 when the compression identifier 263 indicates a stateful compression scheme.

In an embodiment, the NE 104-112 that receives the compressed data may store the compressed message locally in the LSDB 273 and/or the forwarding database 276. In an embodiment, the NE 104-112 that receives the compressed message first decompresses the compressed message to obtain the original message. Then, the NE 104-112 stores the data that has been decompressed in the LSDB 273 and/or the forwarding database 276.

Figure 11:
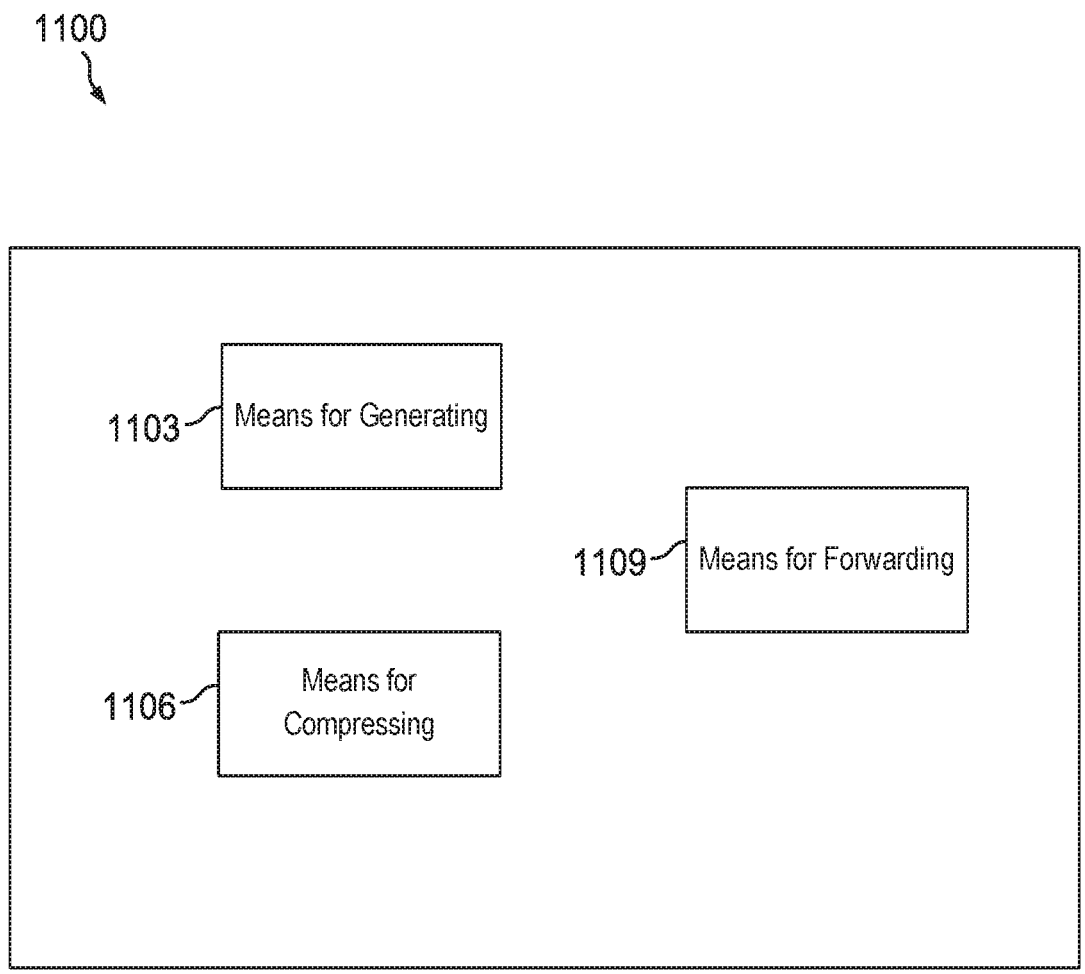
FIG. 11 is a diagram illustrating an apparatus for compressing data using an IGP according to various embodiments of the disclosure.

FIG. 11 is a diagram illustrating an apparatus 1100 for compressing data using an IGP according to various embodiments of the disclosure. The apparatus 1100 comprises a means for generating 1103, a means for compressing 1106, and a means for forwarding 1109. The means for generating 1103 comprises a means for generating a message comprising a header and data, wherein the header comprises a length of the data prior to compressing the data, a length of the data after compressing the data, and a compression identifier. The means for compressing 1106 comprises a means for compressing the data based on a compression scheme identified by the compression identifier to obtain compressed data. The means for forwarding 1109 comprises a means for forwarding a compressed message comprising the header and the compressed data to other NEs in the network.

Figure 12:
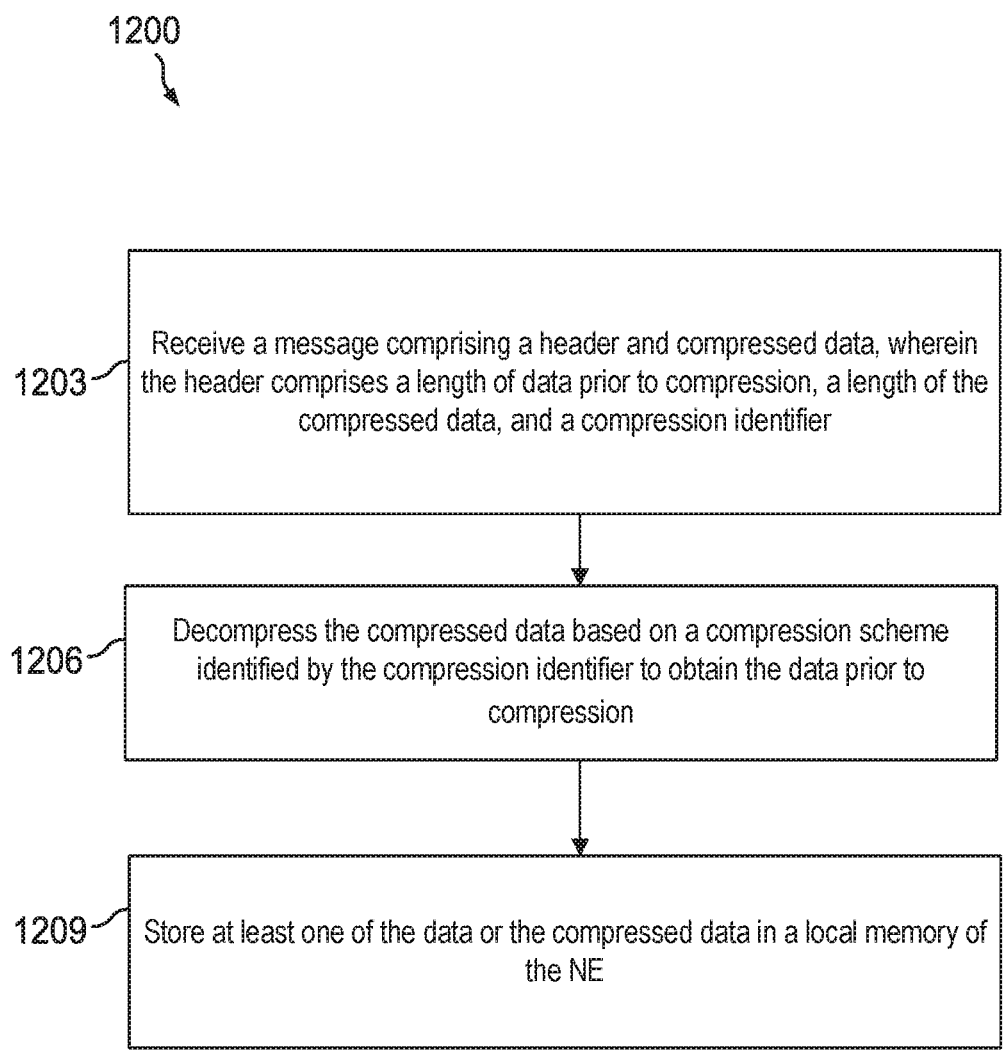
FIG. 12 is a flowchart illustrating a method for decompressing data using an IGP according to various embodiments of the disclosure.

FIG. 12 is a flowchart illustrating a method 1200 for decompressing data using an IGP according to various embodiments of the disclosure. Method 1200 may be performed by one of the NEs 104-112 in the network 100 or by NE 200 implemented as one of the NEs 104-112. Method 1200 is performed after instructions 279 corresponding to different compression schemes, compression identifiers 263 identifying the different compression schemes, dictionaries 270, and/or dictionary identifiers 266 are pre-stored at each of the NEs 104-112.

At step 1203, one of the NEs 104-112 receives a message comprising a header and compressed data. The message may be similar to the message 600, 700, 800, or 900. The header may be similar to the header 601, 701, 801, or 901. The compressed data may be similar to compressed data 625 or 725 or compressed LSAs 840 or 940. In an embodiment, the header comprises a decompressed length 613, which refers to a length of the data prior to compressing the data. The header also comprises a compressed length 606, which refers to a length of the data after compressing the data. The header may also comprise the compression identifier 263. In an embodiment, Tx/Rx 210 receives the message from another NE 104-112 in the network, the central entity 103, or an external device or client.

At step 1206, NE 104-112 decompresses the compressed data based on a compression scheme identified by the compression identifier 263 to obtain uncompressed data (e.g., data prior to compression), such as data 615 or 715 or uncompressed LSAs 840 or 940. For example, the processor 230 executes the compression module 235 to perform decompression on the data based on the compression scheme identified by the compression identifier 263.

For example, when the compression identifier 263 identifies a particular stateless compression scheme (e.g., deflate compression scheme, LZS compression scheme, ITU-T V.44 compression scheme, etc.), NE 104-112 searches the memory 260 for instructions 279 corresponding to the stateless compression scheme. NE 104-112 executes the instructions 279 to decompress the compressed data and output the uncompressed data.

At step 1209, NE 104-112 stores at least one of the uncompressed data or the compressed data in the memory 260. The compressed data, such as compressed data 625 or 725 or compressed LSAs 840 or 940, may be stored in the LSDB 273 and/or the forwarding database 276. The uncompressed data, such as data 615 or 715 or uncompressed LSAs 840 or 940, may be stored in the LSDB 273 and/or the forwarding database 276, to facilitate efficiency of the network 100.

Figure 13:
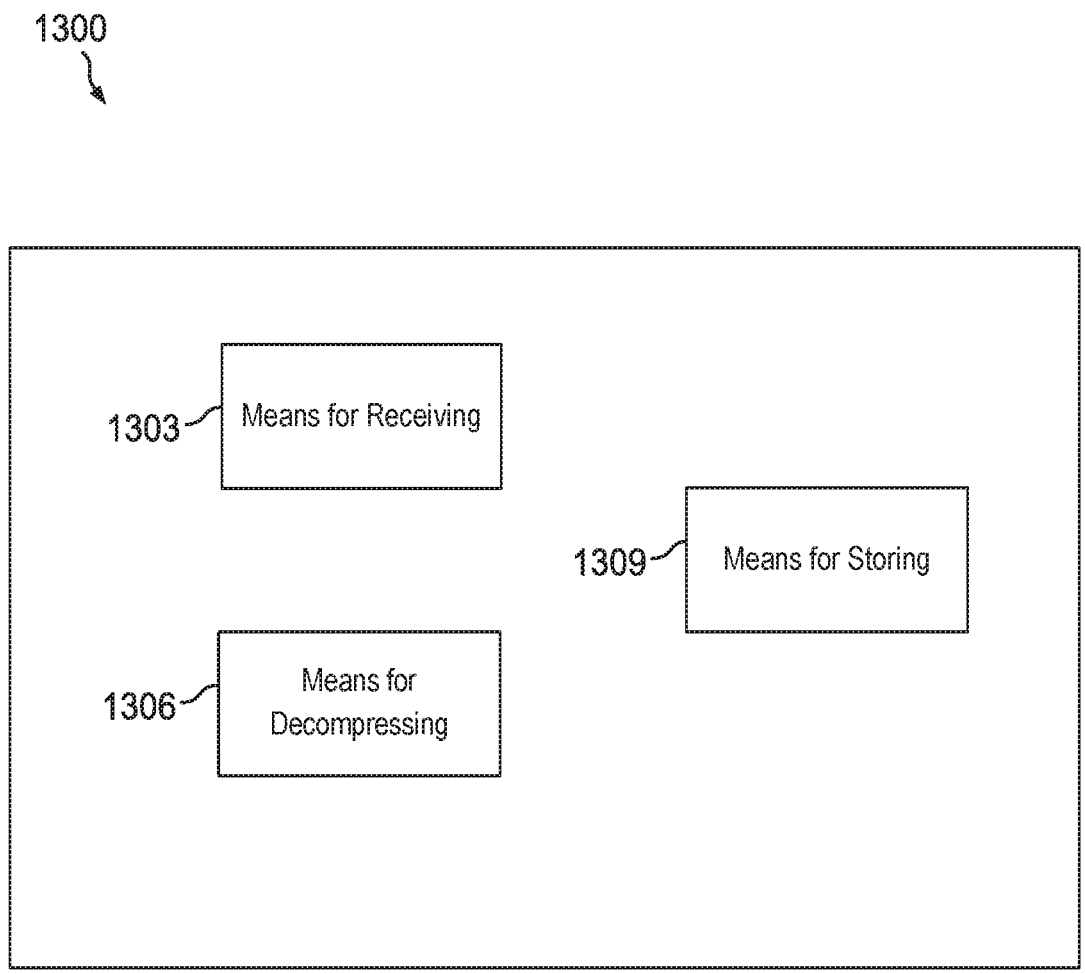
FIG. 13 is a diagram illustrating an apparatus for decompressing data using an IGP according to various embodiments of the disclosure.

FIG. 13 is a diagram illustrating an apparatus 1300 for decompressing data using an IGP according to various embodiments of the disclosure. The apparatus 1300 comprises a means for receiving 1303, a means for decompressing 1306, and a means for storing 1309. The means for receiving 1303 comprises a means for receiving a message comprising a header and data, wherein the header comprises a length of data prior to compression, a length of the compressed data, and a compression identifier. The means for decompressing 1306 comprises a means for decompressing the compressed data based on a compression scheme identified by the compression identifier to obtain uncompressed data. The means for storing 1309 comprises a means for storing at least one of the compressed data or the uncompressed data in a local memory 260.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method performed by a network element (NE) in a network implementing an Interior Gateway Protocol (IGP), comprising:

generating a message comprising a header and data, wherein the header comprises a length of the data prior to compressing the data, a length of the data after compressing the data, and a compression identifier being a value identifying a compression scheme;

compressing the data based on the compression scheme identified by the compression identifier to obtain compressed data; and forwarding a compressed message comprising the header and the compressed data to another NE in the network, wherein the header further comprises a first type field, a decompressed length field, a compressed length field, a compression identifier field, and a second type field, wherein the first type field carries a value indicating that the compressed message carries the compressed data, the decompressed length field carries the length of the data prior to compressing the data, the compressed length field carries the length of the compressed data, the compression identifier field carries the compression identifier, and the second type field carries a value identifying a type of the data being compressed.

2. The method of claim 1, wherein the compression scheme identified by the compression identifier is a stateful compression scheme, wherein the header further comprises a dictionary identifier identifying a dictionary used in compressing the data, and wherein the method further comprises:

receiving the dictionary to use in compressing the data from a stateful compression controller before receiving the message; and storing the dictionary in a memory of the NE.

3. The method of claim 1, wherein the NE is also a stateful compression controller of the network, wherein, before receiving the message, the method further comprises:

monitoring uncompressed messages being flooded through the network to determine a dictionary used for compressing the data forwarded through the network, wherein the dictionary defines an uncompressed bit string and a corresponding compressed codeword;

assigning a dictionary identifier to the dictionary;

transmitting the dictionary identifier and the dictionary to the another NE in the network; and storing the dictionary identifier and the dictionary in a memory of the NE, wherein the compression scheme identified by the compression identifier is a stateful compression scheme, and wherein the header further comprises the dictionary identifier.

4. The method according to claim 3, further comprising:
continuing to monitor the uncompressed messages and compressed messages being flooded through the network to determine an update to the dictionary based on a count of the uncompressed bit string occurring in the uncompressed messages and the compressed messages, wherein the update to the dictionary defines a second uncompressed bit string and a second corresponding codeword; and transmitting the dictionary identifier and the update to the dictionary to the another NE.

5. The method of claim 1, further comprising:

maintaining, at a memory of the NE, a dictionary and a corresponding dictionary identifier, wherein the dictionary stores a plurality of mappings between uncompressed bit strings and corresponding codewords; and maintaining, at the memory of the NE, instructions corresponding to a plurality of different compression schemes and the compression identifier corresponding to each of the plurality of different compression schemes, wherein compressing the data based on the compression scheme identified by the compression identifier comprises executing the instructions corresponding to the compression scheme identified by the compression identifier to compress the data.

6. The method of claim 1, wherein when the compression identifier field carries the compression identifier corresponding to a stateful compression scheme, the header comprises a dictionary identifier field carrying a dictionary identifier corresponding to a dictionary used for compressing the data.

7. The method of claim 1, wherein the header comprises a dictionary identifier field carrying a dictionary identifier corresponding to a dictionary used for compressing the data.

8. A method performed by a network element (NE) in a network implementing an Interior Gateway Protocol (IGP), comprising:

receiving a message comprising a header and compressed data, wherein the header comprises a first type field, a decompressed length field, a compressed length field, a compression identifier field, and a second type field, wherein the first type field carries a value indicating that the message carries the compressed data, the decompressed length field carries a length of data prior to compressing the data, the compressed length field carries a length of the compressed data, the compression identifier field carries a compression identifier identifying a compression scheme, and the second type field carries a value identifying a type of the data being compressed;

decompressing the compressed data based on the compression scheme identified by the compression identifier to obtain the data prior to compression; and storing at least one of the data or the compressed data in a local memory of the NE.

9. The method of claim 8, wherein the header further comprises a dictionary identifier identifying a dictionary used in compressing and decompressing the data, and wherein the method further comprises:

maintaining, at the local memory of the NE, the dictionary and a corresponding dictionary identifier in NE local memory of the NE, wherein the dictionary stores a plurality of mappings between uncompressed bit strings and corresponding codewords; and decompressing the data based on the dictionary identifier and the compression identifier.

10. The method of claim 8, wherein the header further comprises a dictionary identifier identifying a dictionary used in compressing and decompressing the data, and wherein the method further comprises:

maintaining, at the local memory of the NE, instructions corresponding to a plurality of different compression schemes and the compression identifier corresponding to each of the plurality of different compression schemes; and executing the instructions corresponding to the compression scheme identified by the compression identifier to decompress the data.

11. A network element (NE) in a network implementing an Interior Gateway Protocol (IGP), comprising:

a memory configured to store instructions; and one or more processors coupled to the memory, wherein the instructions cause the one or more processors to be configured to:

generate a message comprising a header and data, wherein the header comprises a length of the data prior to compressing the data, a length of the data after compressing the data, and a compression identifier being a value identifying a compression scheme;

compress the data based on the compression scheme identified by the compression identifier to obtain compressed data; and forward a compressed message comprising the header and the compressed data to another NE in the network, wherein the header further comprises a first type field, a decompressed length field, a compressed length field, a compression identifier field, and a second type field, wherein the first type field carries a value indicating that the compressed message carries the compressed data, the decompressed length field carries the length of the data prior to compressing the data, the compressed length field carries the length of the compressed data, the compression identifier field carries the compression identifier, and the second type field carries a value identifying a type of the data being compressed.

12. The NE of claim 11, wherein the compression scheme identified by the compression identifier is a stateful compression scheme, wherein the header further comprises a dictionary identifier identifying a dictionary used in compressing the data, and wherein the instructions further cause the one or more processors to be configured to:

receive the dictionary to use in compressing the data from a stateful compression controller before receiving the message; and store the dictionary in the memory of the NE.

13. The NE of claim 11, wherein the NE is also a stateful compression controller of the network, wherein, before receiving the message, the instructions further cause the one or more processors to be configured to:

monitor uncompressed messages being flooded through the network to determine a dictionary used for compressing the data forwarded through the network, wherein the dictionary defines an uncompressed bit string and a corresponding compressed codeword;

assign a dictionary identifier to the dictionary;

transmit the dictionary identifier and the dictionary to the another NE in the network; and store the dictionary identifier and the dictionary in the memory of the NE, wherein the compression scheme identified by the compression identifier is a stateful compression scheme, and wherein the header further comprises the dictionary identifier.

14. The NE according to claim 13, wherein the instructions further cause the one or more processors to be configured to:
- continue to monitor the uncompressed messages and compressed messages being flooded through the network to determine an update to the dictionary based on a count of the uncompressed bit string occurring in the uncompressed messages and the compressed messages, wherein the update to the dictionary defines a second uncompressed bit string and a second corresponding codeword; and
- transmit the dictionary identifier and the update to the dictionary to the another NE.

15. The NE of claim 11, wherein the memory is configured to:
- store a dictionary and a corresponding dictionary identifier, wherein the dictionary stores a plurality of mappings between uncompressed bit strings and corresponding codewords; and
- store compression instructions corresponding to a plurality of different compression schemes and the compression identifier corresponding to each of the plurality of different compression schemes,
- wherein the instructions further cause the one or more processors to be configured to execute the compression instructions corresponding to the compression scheme identified by the compression identifier to compress the data.

16. The NE of claim 11, wherein when the compression identifier field carries the compression identifier corresponding to a stateful compression scheme, the header comprises a dictionary identifier field carrying a dictionary identifier corresponding to a dictionary used for compressing the data.

17. The NE of claim 11, wherein the header comprises a dictionary identifier field carrying a dictionary identifier corresponding to a dictionary used for compressing the data.

18. A network element (NE) in a network implementing an Interior Gateway Protocol (IGP), comprising:
- a memory configured to store instructions; and
- one or more processors coupled to the memory, wherein the instructions cause the one or more processors to be configured to:
  - receive a message comprising a header and compressed data, wherein the header comprises a first type field, a decompressed length field, a compressed length field, a compression identifier field, and a second type field, wherein the first type field carries a value indicating that the message carries the compressed data, the decompressed length field carries a length of data prior to compressing the data, the compressed length field carries a length of the compressed data, the compression identifier field carries a compression identifier identifying a compression scheme, and the second type field carries a value identifying a type of the data being compressed;
  - decompress the compressed data based on the compression scheme identified by the compression identifier to obtain the data prior to compression; and
  - store at least one of the data or the compressed data in a local memory of the NE.

19. The NE of claim 18, wherein the header further comprises a dictionary identifier identifying a dictionary used in compressing and decompressing the data, wherein the memory is further configured to store the dictionary and a corresponding dictionary identifier in NE local memory of the NE, wherein the dictionary stores a plurality of mappings between uncompressed bit strings and corresponding codewords, and wherein the instructions further cause the one or more processors to be configured to decompress the data based on the dictionary identifier and the compression identifier.

20. The NE of claim 18, wherein the header further comprises a dictionary identifier identifying a dictionary used in compressing and decompressing the data, wherein the memory is further configured to store instructions corresponding to a plurality of different compression schemes and the compression identifier corresponding to each of the plurality of different compression schemes, and wherein the instructions further cause the one or more processors to be configured to execute the instructions corresponding to the compression scheme identified by the compression identifier to decompress the data.

* * * * *